United States Patent
Matsumoto et al.

(10) Patent No.: US 6,869,746 B2
(45) Date of Patent: Mar. 22, 2005

(54) PHOTOPOLYMERIZABLE COMPOSITION AND RECORDING MATERIAL USING THE SAME

(75) Inventors: Hirotaka Matsumoto, Shizuoka-ken (JP); Shintaro Washizu, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 146 days.

(21) Appl. No.: 10/120,392

(22) Filed: Apr. 12, 2002

(65) Prior Publication Data

US 2003/0059705 A1 Mar. 27, 2003

(30) Foreign Application Priority Data

Apr. 12, 2001 (JP) .................................. 2001-114565

(51) Int. Cl.[7] .............................................. G03F 7/004
(52) U.S. Cl. ................. 430/270.1; 430/138; 430/281.1; 430/919
(58) Field of Search ............................. 430/270.1, 138, 430/281.1, 919; 522/14, 29, 25

(56) References Cited

U.S. PATENT DOCUMENTS

| | | | | |
|---|---|---|---|---|
| 5,143,818 A | * | 9/1992 | Weed et al. | 430/281.1 |
| 5,168,032 A | * | 12/1992 | Okamoto et al. | 430/281.1 |
| 5,932,393 A | * | 8/1999 | Cunningham et al. | 430/281.1 |
| 6,045,974 A | * | 4/2000 | Cunningham et al. | 430/281.1 |
| 6,210,863 B1 | * | 4/2001 | Cunningham et al. | 430/281.1 |

FOREIGN PATENT DOCUMENTS

| | | | | |
|---|---|---|---|---|
| EP | 276016 A2 | * | 7/1988 | G03C/1/68 |
| EP | 619520 A1 | * | 10/1994 | C08F/2/50 |
| EP | 1035124 A1 | * | 9/2000 | C07F/5/02 |
| JP | 64-78247 | * | 3/1989 | G03C/1/68 |
| JP | 03293670 A | * | 12/1991 | G03F/7/028 |
| JP | 3-293670 | * | 12/1991 | G03F/7/028 |
| JP | 10268518 A | * | 10/1998 | G03F/7/038 |
| JP | 2001290267 A | * | 10/2001 | G03F/7/027 |
| JP | 2001305734 A | * | 11/2001 | G03F/7/029 |

OTHER PUBLICATIONS

English language abstract of JP 03–293670.*
Machine translation of JP 10–268518.*
Machine translation of JP 2001–290267.*
English abstract of JP 2001–305734.*
English abstract of JP 2001–290267.*
English abstract of JP 64–078247.*
English abstract of JP 03–293670.*

* cited by examiner

Primary Examiner—Amanda Walke
(74) Attorney, Agent, or Firm—Sughrue Mion, PLLC

(57) ABSTRACT

The present invention provides a photopolymerizable composition comprising a polymerizable compound including an addition-polymerizable unsaturated bond, a photo-radical-generating agent, and an amine compound represented by the following general formula (I) and a recording material comprising a recording layer containing the photopolymerizable composition:

General formula (I)

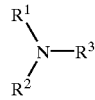

in which: $R^1$ and $R^2$ each represent a hydrogen atom or an aliphatic group, and may be the same as or different from one another; each aliphatic group may be further substituted; $R^1$ and $R^2$ may form a ring by bonding directly or via a substituent; and $R^3$ represents a benzyl group, which may be further substituted.

17 Claims, No Drawings

PHOTOPOLYMERIZABLE COMPOSITION AND RECORDING MATERIAL USING THE SAME

BACKGROUND OF THE PRESENT INVENTION

1. Field of the Present Invention

The present invention relates to a monochromatic or multi-color recording material enabling a variety of light sources emitting light rays covering ultraviolet to infrared regions to be used and a photopolymerizable composition to be used for the material, more particularly a photopolymerizable composition with improved sensitivity, storage property, and photo fixation property and a recording material using the composition.

2. Description of the Related Art

Before, a variety of investigations of a dry type image recording method without using any developer liquid or the like and free from waste generation has been performed and among them, a method using a composition curable by light has drawn attention.

In such a method, a latent image is formed by exposing to light a composition, which is contained in a recording material and cured by light, and by curing it. On the other hand, a color image is formed due to the transfer of a component in unexposed areas, which affects coloration or decoloration reaction by heating, whthin the recording material. In the case of using such a recording material, at first, exposure is carried out by radiating light to the recording material through an image manuscript, a latent image is formed by curing the exposed areas, and then a visible image is formed by heating the recording material and by transferring the component in the un-cured areas (the un-exposed areas), which affects coloration or decoloration reactions, within the recording material.

By this method, a completely dry system free from waste generation can be achieved.

As the recording material to be employed for the above-described process, substantially, there are several types and they can characteristically be employed for black and white image recording process, yet they are especially advantageous for color image recording. As a specific recording material, for example, a two-component type photosensitive and heat sensitive recording material disclosed in Japanese Patent Application Laid-Open (JP-A) No. 52-89915 is known. The material is a heat sensitive recording material using, as the two-components, for example, an electron-accepting compound and an electron-donating colorless coloring material and containing a photo-curable composition inside or outside or both of microcapsules.

However, this recording material cannot sufficiently suppress the coloration in the cured areas even if the photo-curable composition contained in the microcapsules is sufficiently cured. Therefore, non-image areas are colored and the contrast tends to be decreased.

As a recording material free from coloration in the non-image areas, for example, a recording material is known which is disclosed in JP-A No. 61-123838 and has a layered structure comprising a layer of a photopolymerizable composition containing an acidic group-containing vinyl monomer and a photopolymerization initiator, an isolation layer, and a layer of an electron-donating colorless coloring material.

In the case of this recording material, the non-image areas, that is, the areas cured by photopolymerization reaction, have no heat diffusion property of the acidic group and are not colored. However, on the other hand, it has a disadvantage that the coloring density itself is slightly low.

Also, as a negative type recording material image using a similar image forming method, there is a recording material disclosed in JP-A No. 60-119552. It is a recording material in which a photopolymerizable composition containing a monomer or a prepolymer for bleaching a coloring material and a photopolymerization initiator is isolated from a coloring material to be bleached. Similarly to the above-described recording material, this recording material also has a disadvantage that the coloring density is slightly low, although the non-image areas are not colored.

Present inventors, taking account of the above-described disadvantages, have proposed recording materials before, disclosed in JP-A Nos. 3-87827 and 4-211252, as recording materials capable of decreasing the coloration in the non-image areas and obtaining a high image density. The former recording material is a photosensitive and heat sensitive recording material which comprises one of the two color forming components which is encapsulated in microcapsules and the other as a curable compound of a photo-curable composition or the other together with a photo-curable composition outside the microcapsules. On the other hand, the latter recording material is a photosensitive and heat sensitive recording material which comprises a layer formed by coating and containing microcapsules encapsulating an electron-donating colorless coloring material and a photo-curable composition containing an electron-accepting compound, a polymerizable vinyl monomer, and a photopolymerization initiator outside the microcapsules.

Recording of a color image using such a photosensitive and heat sensitive recording material can be carried out using a recording material comprising a plurality of recording layers having different sensitive light wavelength and coloration hue from one another and disposed on a support.

As a multi-color photosensitive and heat sensitive recording material, for example, the above-described photosensitive and heat sensitive recording materials proposed by the present inventors can be exemplified and more specifically, the proposed recording material comprises a plurality of recording layers which are sensitive to light rays with different wavelengths and different colors, respectively: a first recording layer which is sensitive to light rays with central wavelength $\lambda_1$ and forms first color, an intermediate layer absorbing light rays with central wavelength $\lambda_1$, a second recording layer which is sensitive to light rays with central wavelength $\lambda_2$ and forms second color different from the first color, . . . , an intermediate layer absorbing light rays with central wavelength $\lambda_{i-1}$, an ith ($I \geq 2$) recording layer which is sensitive to light rays with central wavelength $\lambda_i$ and forms ith color different from those of the first, the second, . . . , and the (i-1)th recording layers layered in this order in the direction from the exposure light source to the support, with the central wavelength $\lambda$ at this time $\lambda_1 < \lambda_2 < \lambda_i$.

Although these recording materials can be used for a variety of purposes, it is impossible to carry out image recording by a light source other than UV rays and short-wavelength visible light rays; i.e., it is impossible to make use of compact, economical infrared lasers, or light rays from blue to red.

Further, in order to permit a high speed and highly accurate image formation, in the case of using such a small and economical infrared laser and light rays covering blue to red color, it is required to introduce a coloring material or the like having absorptivity in the ultraviolet to infrared ray regions into the recording layers. However, if these coloring materials and the like, above all, coloring materials having absorptivity in the visible light region, are used, the background textures are colored and images with low contrast and inferior quality are formed. On the other hand, if a coloring material having absorptivity in the near infrared ray region is used, the coloration of the background textures can be suppressed, yet the used laser is expensive.

On the other hand, as a pressure sensitive recording material, for example, the photosensitive pressure sensitive recording materials disclosed in U.S. Pat. Nos. 4,399,209 and 4,440,846 can be exemplified. Such a recording material contains a dye precursor as an image forming agent in microcapsules and is used for forming a visible image by exposing it imagewise and then evenly applying pressure thereto so as to break the microcapsules in the non-photocured areas and cause reaction of the dye precursor released from the capsules with a developer out of the capsules. As a multi-color recording material of this type, those disclosed in U.S. Pat. Nos. 339,917 and 4,576,891 can be exemplified.

However, in this type of recording materials, since almost all of the compositions to be photocured have photosensitivity in a short wavelength range, similarly to the above-described photosensitive and heat sensitive recording materials, it is impossible to carry out image recording by a light source other than UV rays and short-wavelength visible light rays; i.e., it is impossible to make use of compact, economical infrared lasers, or light rays from blue to red.

Further, when a coloring material having absorptivity in the ultraviolet to infrared ray regions is used in order to make a high speed and highly accurate image formation possible, drawbacks arise in which the background textures are colored and images with low contrast and inferior quality are obtained.

SUMMARY OF THE PRESENT INVENTION

The present invention aims to solve above-described conventional problems and achieve the following objects. That is, an object of the present invention is to provide a photopolymerizable composition with improved sensitivity, storage property, photo-fixation property. Also, another object of the present invention is to provide a monochrome or color recording material which has a high sensitivity and can form an image with a high contrast and high quality in a completely dry system without generating waste and requiring use of a developer liquid by using the above-described photopolymerizable composition.

Regarding constituent components of a recording layer of a recording material and an image recording method for forming an image on the recording material by exposing the recording material imagewise, forming a latent image by curing a composition, which cures by photopolymerization (hereinafter, referred to as photopolymerizable composition), existing outside microcapsules, and then making coloring components form color by heating or pressurizing the material, the present inventors have studied hard and consequently found that it is possible not only to improve the photopolymerization sensitivity and raw storage property of a photopolymerizable composition but also to obtain a image with high quality and a high contrast by using a specific photo-radical-generating agent and, as a polymerization assisting agent, an amine compound in the recording layer and fixing the formed image by further radiating light to the surface of the recording layer after image formation and as a result inventors have achieved the present invention.

That is, a first aspect of the present invention provides a photopolymerizable composition including: a polymerizable compound including an addition-polymerizable unsaturated bond; a photo-radical-generating agent; and an amine compound represented by the following general formula (I):

General formula (I)

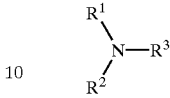

in which: $R^1$ and $R^2$ each represent a hydrogen atom or an aliphatic group, and may be the same as or different from one another; each aliphatic group may be further substituted, and may form a ring by bonding directly or via a substituent; and $R^3$ represents a benzyl group, which may be further substituted.

A second aspect of the present invention provides a recording material comprising a recording layer on a support and the recording layer contains the photopolymerizable composition.

A third aspect of the present invention provides a recording material comprising a recording layer on a support and the recording layer contains at least microcapsules encapsulating a coloring component and the photopolymerizable composition and the polymerizable compound having ethylenic unsaturated bond is a compound having a site for coloring the coloring component by reaction with the coloring component.

A fourth aspect of the present invention provides a recording material comprising a recording layer on a support and the recording layer contains microcapsules encapsulating a coloring component, a coloring compound coloring by reaction with the coloring component, and the photopolymerizable composition and the polymerizable compound having ethylenic unsaturated bond is a compound having a site for suppressing the reaction of the coloring component and the coloring compound.

DETAILED DESCRIPTION OF THE PREFERRED EMBODIMENTS

Hereinafter, a photopolymerizable composition and a recording material of the present invention will be described in details.

<Photopolymerizable Composition>

A photopolymerizable composition used in the present invention is a composition to be used preferably for a recording material and a recording method, which will be described later, and contains at least a polymerizable compound (hereinafter, sometimes referred to simply as polymerizable compound) having an addition-polymerizable unsaturated bond, a photo-radical-generating agent, an amine compound represented by the following general formula (I) (hereinafter, sometimes referred to simply as amine compound), and further preferably an organic dye.

The organic dye, the photo-radical-generating agent, and the amine compound have a function as photopolymerization initiator which generates radical by exposure them to light and cause polymerization reaction in the layer and promotes the reaction. Due to the polymerization reaction, the recording layer film is cured and a latent image with a desired pattern can be formed. The photo-radical-generating agent and the amine compound can be used for any cases of recording materials (a) to (c), which will be described later.

(Amine Compound)

The amine compound contained in a photopolymerizable composition of the present invention is represented by the following general formula (I). In the presence of the polymerizable compound and the photo-radical-generating agent together with the amine compound, the amine compound works as a polymerization assisting agent and improves the photopolymerization sensitivity and raw storage property.

General formula (I)

In the general formula (I), $R^1$ and $R^2$ each represent a hydrogen atom or an aliphatic group, and may be the same as or different from one another; each aliphatic group may be further substituted; $R^1$ and $R^2$ may form a ring by bonding directly or via a substituent; and $R^3$ represents a benzyl group, which may be further substituted.

Examples of the amine compound are exemplified as follows, however the amine compound of the present invention is not limited to these.

ably from 1/100 to 1/5; and most preferably from 1/50 to 1/10. If the ratio is within a range from 1/1,000 to 1/1, the photopolymerization reactivity and the storage property are sufficiently improved. In other words, the photopolymerization sensitivity and the raw storage property are good.

(Photo-radical-generating Agent)

A photo-radical-generating agent can generate radical by exposing it to light and cause polymerization reaction and promote the reaction. Examples of the photo-radical-generating agent include benzophenone and acetophenone derivatives such as α-hydroxyacetophenone and α-aminoacetophenone, 4-aroyl-1,3-dioxolane, benzoin alkyl ether and benzyl ketal, monoacylphosphine oxide, bis (acylphosphine) oxide and titanocene, fluoresene, anthraquinone, thioxanethone or xanethone, lophine dimer, trihalomethyl compounds and dihalomethyl compounds, activated ester compounds, and organic boron compounds, and above all, the organic boron compounds represented by the following general formula (II) are particularly preferable.

General Formula (II)

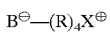

In the general formula (II), R represents an alkyl group, an aryl group, an aralkyl group, an alkenyl group, an alkynyl (1)

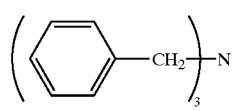

(2)

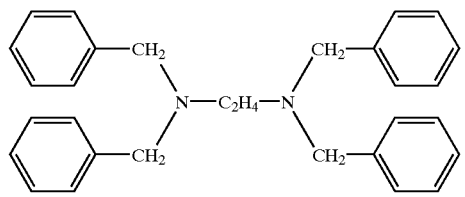

(3)

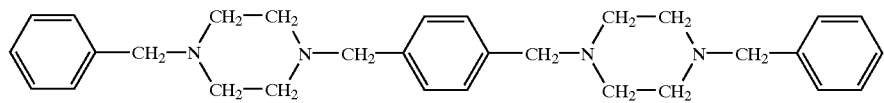

(4)

(5)

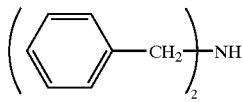

(6)

(7)

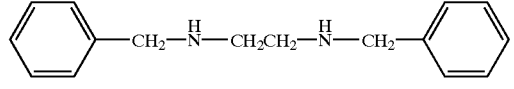

(8)

(9)

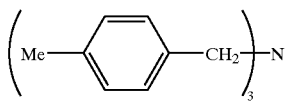

(10)

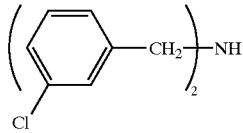

(11)

Further, the ratio of the amine compound and the polymerizable compound is preferably from 1/1,000 to 1/1 (amine compound/polymerizable compound); more prefergroup, a heterocyclic group, or their derivatives and may be same as or different from one another. Further, among them, two or more of them may be bonded directly or through a substituent group to form a boron-containing heteroring. Moreover, the functional group may contain a substituent group. X represents a group capable of forming a cation.

Examples of the organic boron compound include organic boron compounds disclosed in JP-A Nos. 62-143044, 9-188685, 9-188686, 9-188710, Japanese Patent Application No. 11-108466. In the presence of the organic boron compound together with the organic dye, the organic dye is efficiently sensitized to an exposure light with a wavelength range of the spectral absorption of the organic dye, so that high sensitivity can be achieved and radical generation can be controlled using an optional light source covering ultraviolet to infrared regions.

Specific examples of the organic boron compound are as follows [(1) to (19) and (A-1) to (A-13)], however the organic boron compound used in the present invention is not limited to these.

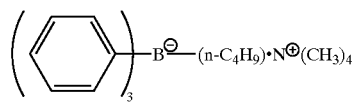
(1)

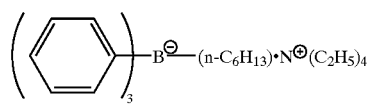
(2)

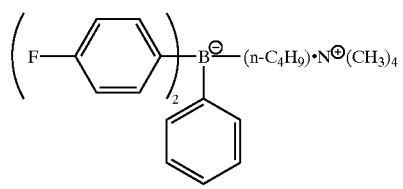
(3)

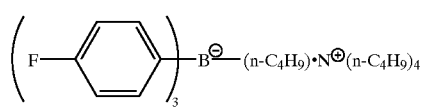
(4)

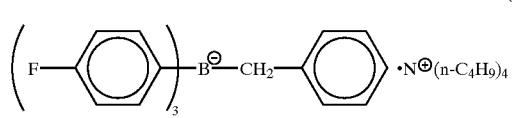
(4-i)

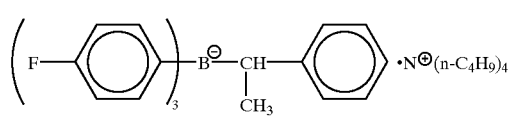
(4-ii)

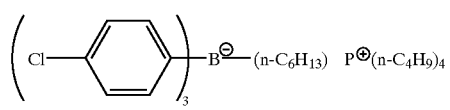
(5)

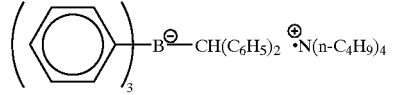
(6)

-continued

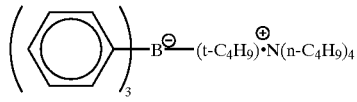
(7)

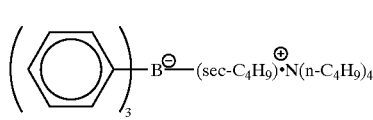
(8)

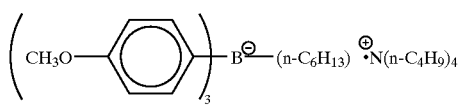
(9)

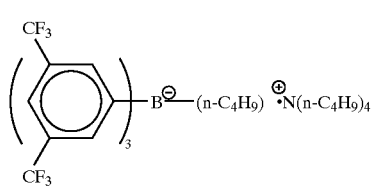
(10)

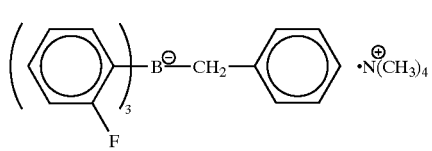
(11)

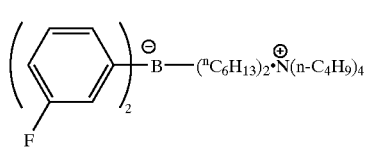
(12)

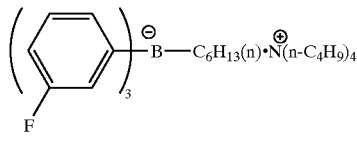
(12-i)

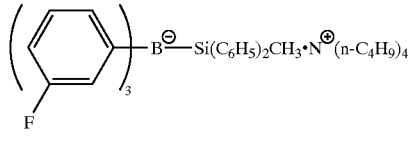
(13)

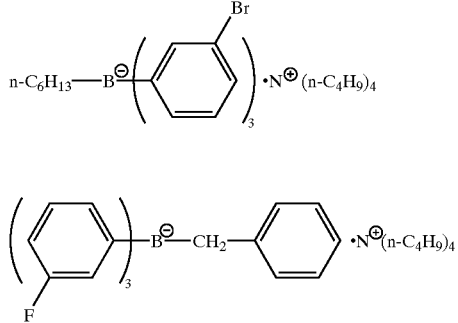
(14)

(15)

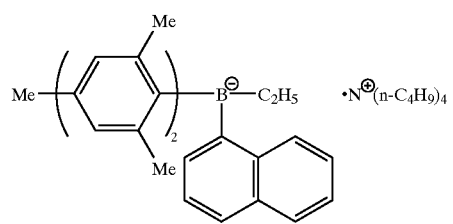 (16)
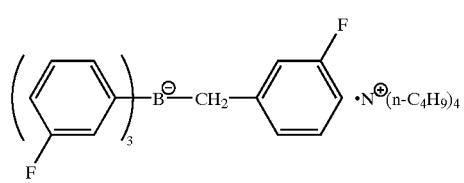 (17)
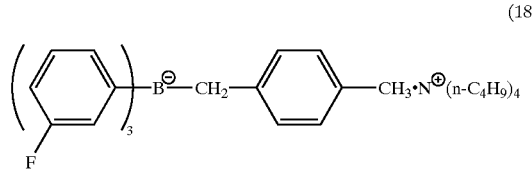 (18)
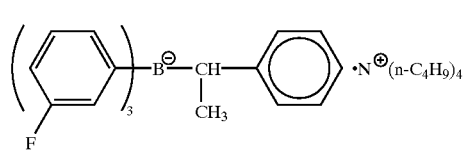 (19)
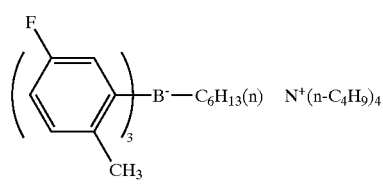 A-1
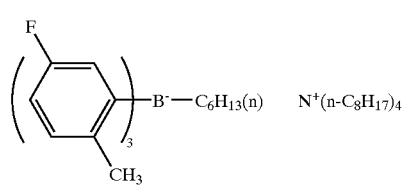 A-2
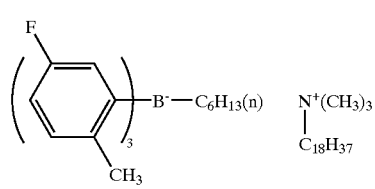 A-3
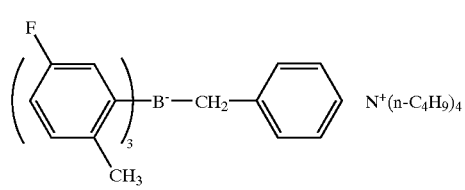 A-4
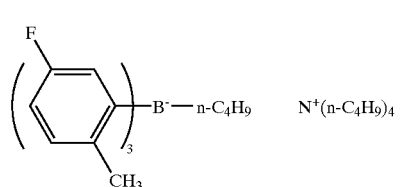 A-5
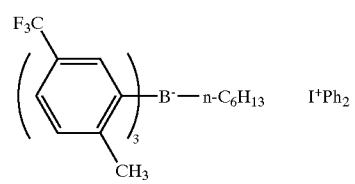 A-6
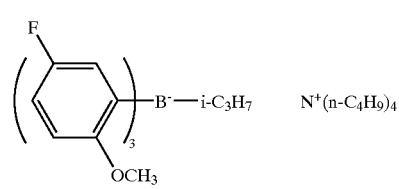 A-7
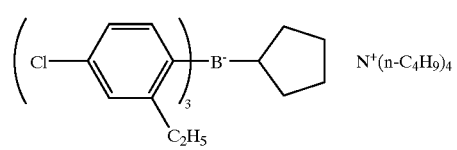 A-8
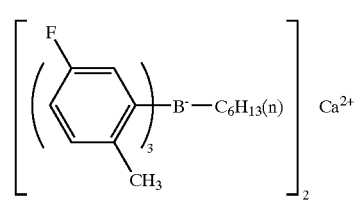 A-9
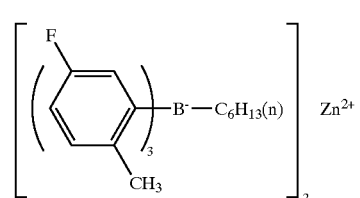 A-10
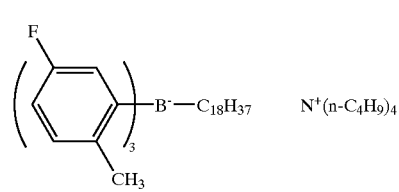 A-11
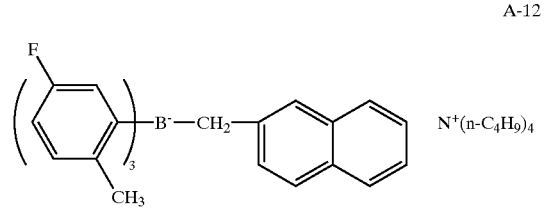 A-12
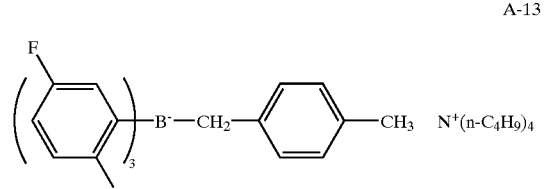 A-13
Further, in the photopolymerizable composition of the present invention, at the time of separately adding the organic dye, which will be described later, and the organic boron compound to the composition, the use ratio is extremely important in views of high sensitivity and the achievement of a sufficient decoloration property by light radiation in the fixation process in a recording method, which will be described later.

In addition to the ratio (=1/1 by mole) of the organic dye and the organic boron compound, addition of the organic boron compound in an amount necessary to sufficiently decolor the organic dye remaining in the recording layer is especially preferable in terms of the achievement of the high sensitivity and decoloration capability.

That is, the ratio of the organic dye/organic boron compound is preferably in a range from 1/1 to 1/50, more preferably from 1/1.2 to 1/30, and most preferably from 1/1.2 to 1/20. In the case the ratio is from 1/1 to 1/50, sufficient polymerization reactivity and decoloration property can be obtained and coating ability can be prevented from deterioration.

Consequently, in the present invention, by using 1 mole or more of the organic boron compound to 1 mole of the organic dye the sensitivity, the storage property, the photo-fixation property, and decoloration of the organic dye can be improved.

In the photopolymerizable composition of the present invention, a single or a plurality of kinds of organic boron compounds may be used. In the case of using a plurality of kinds of organic boron compounds, the total amount of all of the organic boron compounds may be 1 mole or more. In the case of using a plurality of kinds of the organic boron compounds together, the organic boron compounds capable of improving the sensitivity can be utilized in a variety of standpoints.

Further, the total amount of the organic dye and the organic boron compounds in the photopolymerizable composition of the present invention ranges preferably from 0.1 to 10% by weight, more preferably from 0.1 to 5% by weight, and most preferably 0.1 to 1% by weight, to the use amount of a polymerizable compound having an addition-polymerizable unsaturated bond, which will be described later. The use amount ranging from 0.1% by weight to 10% by weight makes it possible to maintain the storage stability and coating ability.

To the extent that they do not affect the effects of the present invention, compounds which interact with the organic dye, especially those in paragraph No. [0145] to [0151] of Japanese Patent Application No. 11-36308, may be used in the photopolymerizable composition of the present invention. As these compounds which interact with the organic dye, benzoin ethers, S-triazine derivatives having a trihalogen-substituted methyl group, organic peroxides, and azinium chlorides are preferable.

To the photopolymerizable composition of the present invention, for the purpose to promote the polymerization reaction, a reducing agent such as an oxygen scavenger or a chain transport assisting agent of an active hydrogen donor and other compounds for promoting the polymerization in chain transportation manner may be further added as an assisting agent.

As the oxygen scavenger, phosphine, a phosphonate, a phosphite, and other compounds easy to be oxidized by an Ag(I) salt or oxygen can be exemplified.

Substantially, they are N-phenylglycine, trimethylbarbituric acid, N,N-dimethyl-2,6-diisopropylaniline, N,N-2,4,6-pentamethylanilinic acid. Further, thiols, thioketones, trihalomethyl compounds, lophine dimer compound, iodonium salts, sulfonium salts, azinium salts, organic peroxides, and azides are also useful as the polymerization promoting agent.

(Organic Dye)

As the organic dye, well-known compounds may properly be selected and among them, organic dyes having the maximum absorption wavelength in a range from 300 to 1,000 nm are preferable.

High sensitivity can be achieved by selecting an optional and desired coloring material from the organic dyes having the absorption wavelength in the above-described wavelength range and adjusting the photosensitive wavelength suitably to a light source to be employed. Further, as the light source to be employed for image exposure, the light source from blue-, green-, red-color light sources, infrared laser, and the like can be selected.

Consequently, in the case of forming a color image using a multi-color recording material having a layered structure of monochromic recording layers which form different colors, addition of an organic dye functioning as a spectral sensitizing coloring material having different absorption wavelength to respective monochromic layers is which form different colors and employment of a light source suitable for the absorption wavelength make it possible to provide a multi-color recording material with a high sensitivity and a high sharpness because each layer (each color) forms an image with a high sensitivity and a high contrast.

Examples of the organic dye are those disclosed in the above-described Patents referring to the organic boron compounds, "Research Disclosure Vol. 200, 1980 December, Item 20036", "Sensitizer", pp. 160–163, Kodansha Publisher, Tokumaru Katsuki/Okawara Shin editor, 1987, and the like. The organic dye contained in the photopolymerizable composition of the present invention can be any of cationic (in form of a salt with the organic boron compound), anionic or nonionic coloring materials.

Specific examples are 3-ketocumarin described in JP-A No. 58-15603, thiopyrylium salt described in JP-A No. 58-40302, naphthothioazole merocyanine compounds described in Japanese Patent Application Publication (JP-B) Nos. 59-28328 and 60-53300, merocyanine compounds described in JP-B Nos. 61-9621, 62-3842, JP-A Nos. 59-89303, 60-60104, merocyanine coloring materials including thiobarbituric acid, hemioxanol coloring materials, cyanines having indolenine nuclei, hemicyanine, merocyanine coloring materials described in JP-A Nos. 62-150242, 64-59345, JP-B No. 8-9643, Japanese Patent Application Nos. 11-20089, 11-323838, 11-367432, 2000-34935, 2000-38861, 2000-38872, and 2000-142112.

Further, the examples include the coloring materials described in "Chemistry of Functional Colorant", CMC publisher, pp. 393–416 (1981), "Coloring Material", 60 [40], 212–224 (1987), and the like. Specifically, cationic methine coloring materials, cationic carbonium coloring materials, cationic quinoneimine coloring materials, cationic indoline coloring materials, cationic styryl coloring materials can be exemplified.

The above-described organic dyes include keto coloring materials such as cumarin (including ketocumarin or sulfonocumarin) coloring materials, merostyryl coloring materials, oxonol coloring materials, hemioxonol coloring materials; non-keto coloring materials such as non-ketopolymethine coloring materials, triarylmethane coloring materials, xanthene coloring materials, anthracene coloring materials, Rhodamine coloring materials, acridine coloring materials, aniline coloring materials, and azo coloring materials; non-keto coloring materials such as azomethine coloring materials, cyanine coloring materials, carbocyanine coloring materials, dicarbocyanine coloring materials, tricarbocyanine coloring materials, hemicyanine coloring materials, and styryl coloring materials; and quinoneimine coloring materials such as azine coloring materials, oxazine coloring materials, thiazine coloring materials, quinoline coloring materials, and thiazole coloring materials.

Specific examples (1-1 to 3-15) of the cationic, anionic, and nonionic organic dyes will be exemplified as follows, yet the present invention is not limited to them.

(Cationic type organic dye)

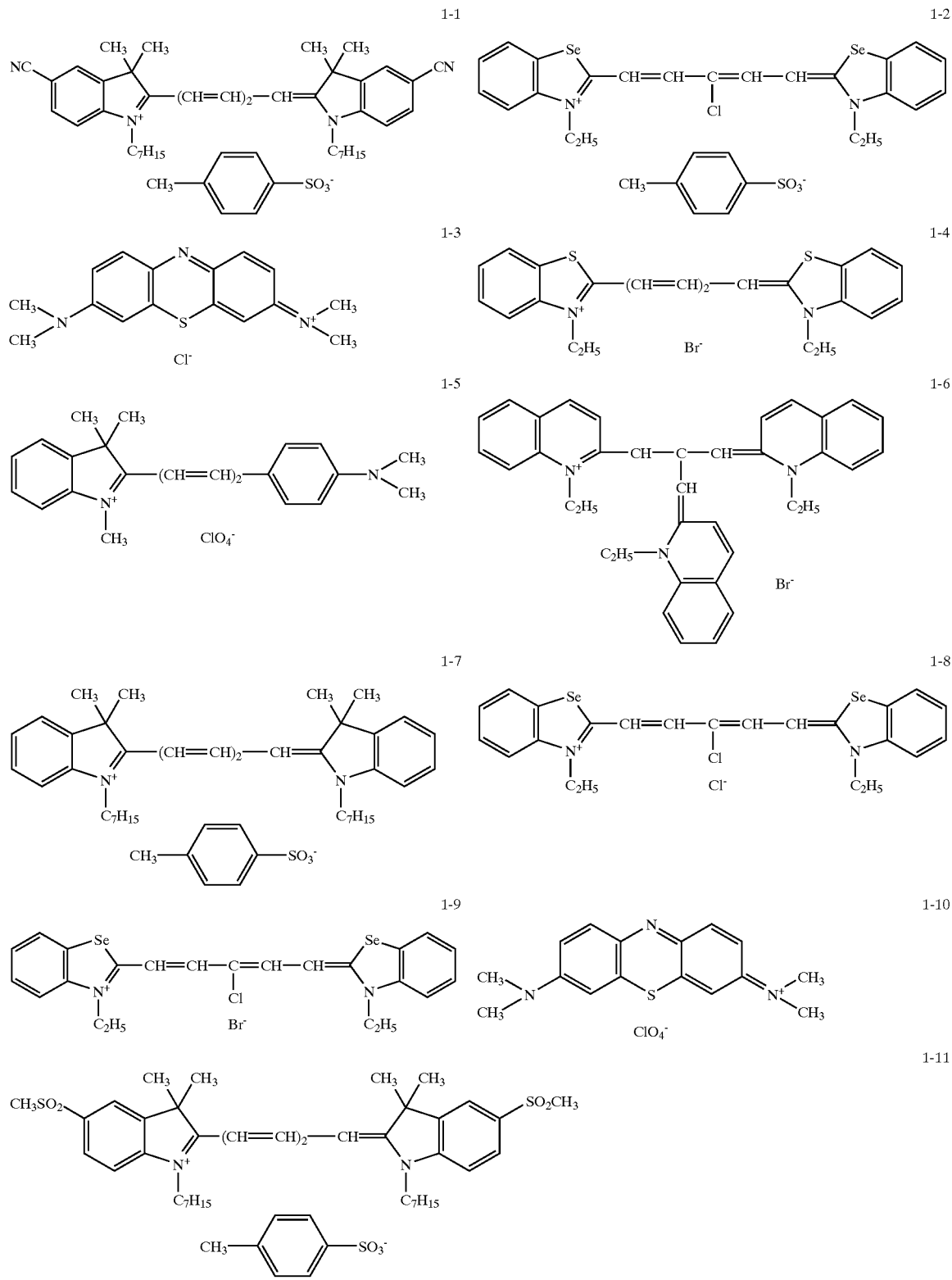

-continued
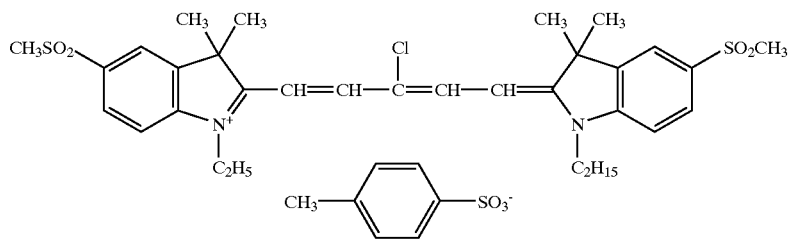
1-12
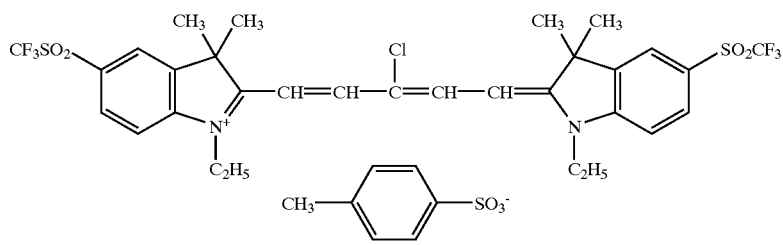
1-13
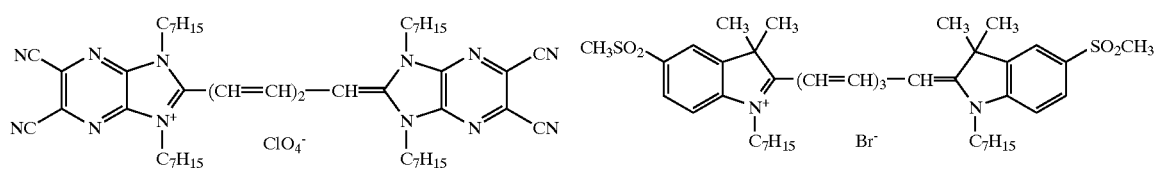
1-14 1-15
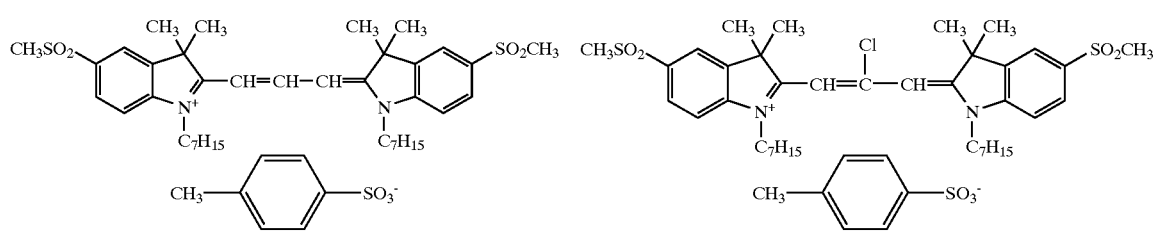
1-16 1-17
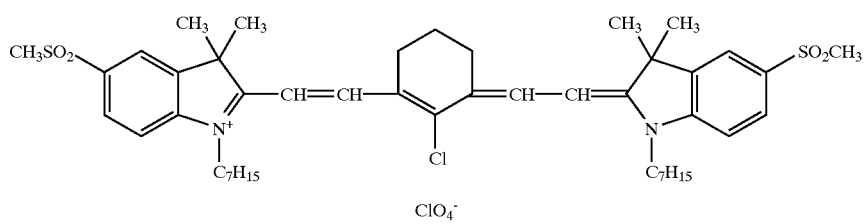
1-18
(Anionic type organic dye)
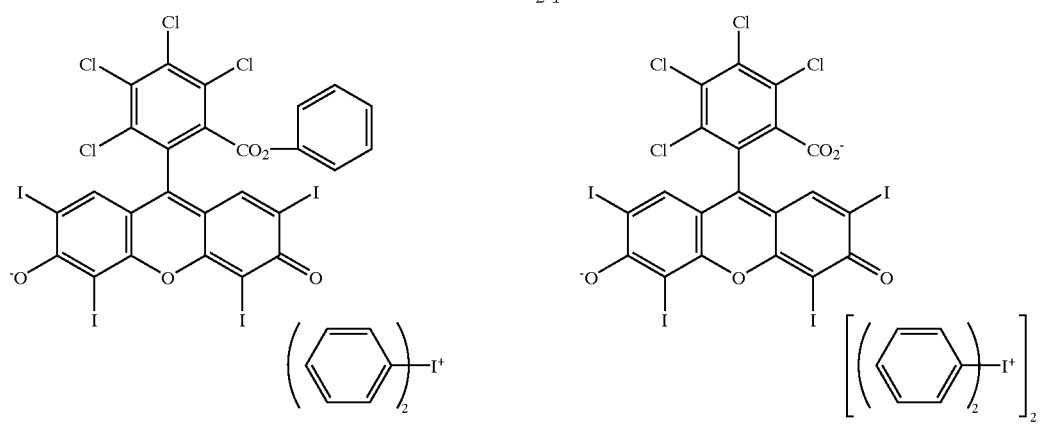
2-1 2-2

2-3
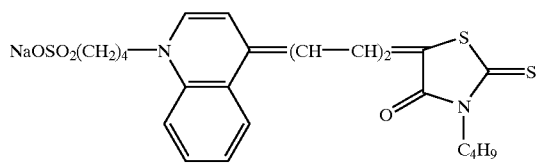
2-4
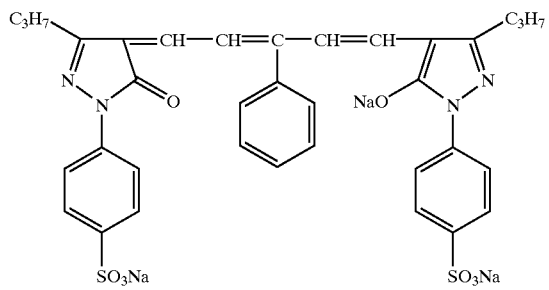
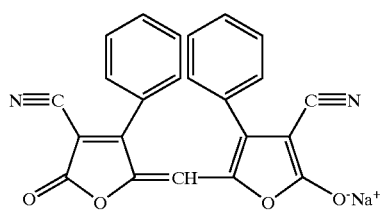
(Nonionic type organic dye)
2-5
3-1
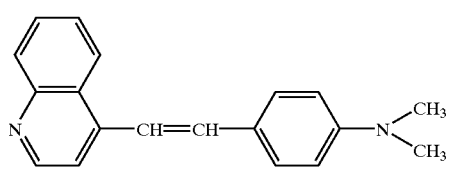
3-2
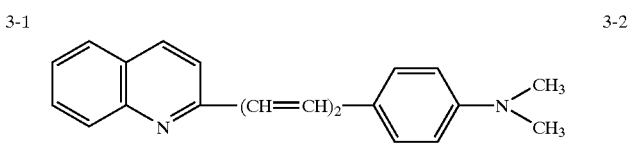
3-3
3-4
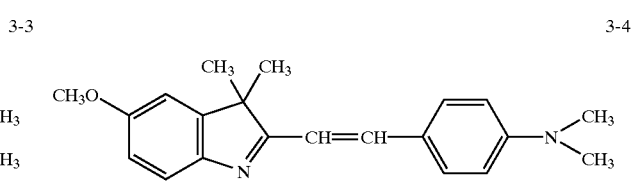
3-5
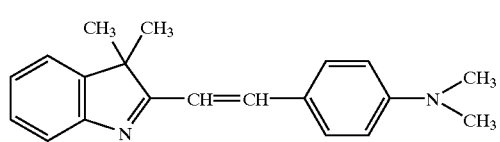
3-6
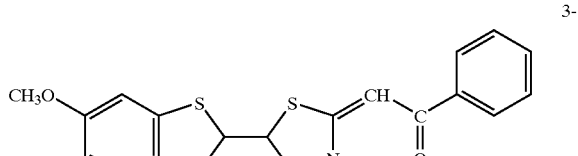
3-7
3-8
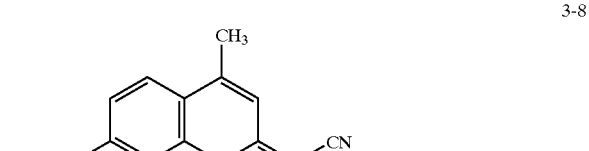
3-9
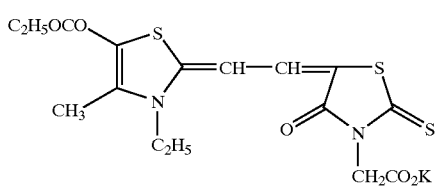
3-10
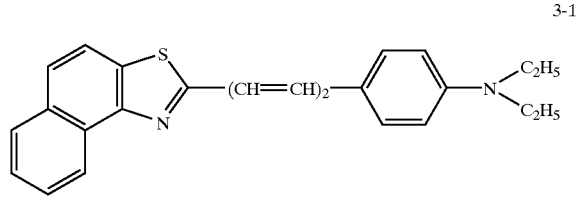

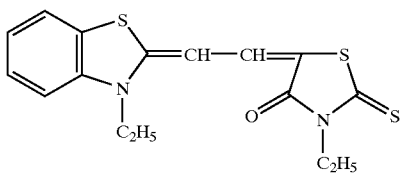

3-11

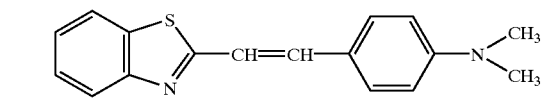

3-12

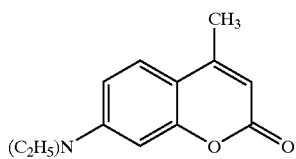

3-13

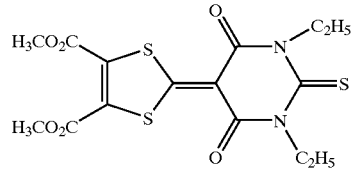

3-14

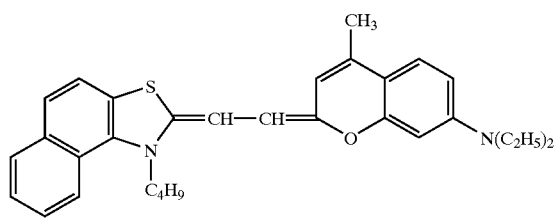

3-15

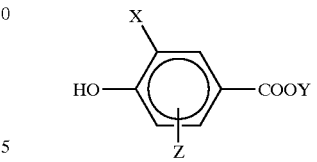

3-16

Proper use of the organic dyes makes it possible to obtain the photopolymerizable composition of the present invention with a spectral sensitivity in a range from ultraviolet to infrared regions.

Further, the above-described organic dye may be used solely or two or more thereof can be used in combination.

The use amount of the organic dyes is in a range preferably from 0.1 to 5% by weight, more preferably 0.5 to 2% by weight, to the total amount of the photosensitive and heat sensitive recording layer or photosensitive and pressure sensitive recording layer.

(Polymerizable Compound)

As the polymerizable compound having an addition polymerizable unsaturated bond and contained in the photopolymerizable composition, any compound can be used if they have an addition-polymerizable unsaturated bond and are capable of being polymerized to form a film. In the present invention, those which are polymerized and cured by photoreaction are preferable. For example, a substantially colorless compound having a polymerizable group and a site capable of forming color by reaction with a coloring component in a molecule (hereinafter sometimes referred to as compound (i)), a substantially colorless compound having a polymerizable group and a site suppressing the reaction of a coloring component with other compound in a molecule (hereinafter sometimes referred to as compound (ii)).

-Compound (i)-

As the compound (i) to be used for the photosensitive and heat sensitive recording material which compound (i) is substantially colorless and has a polymerizable group and a site capable of forming color by reaction with a coloring component in a molecule, any compounds such as electron-accepting compounds having a polymerizable group or coupler compounds having a polymerizable group can be used if the compounds are capable of forming color by reaction with a coloring component and polymerizing and curing by photoreaction.

As the polymerizable electron-accepting compounds, that is, compounds having an electron-accepting group and a polymerizable group in a molecule, any compounds can be use if they have a polymerizable group and is capable of forming color by reaction with an electron-donating colorless dye, one of coloring components.

Examples of the electron-accepting compounds include compounds which can be synthesized based on reference concerning 3-halo-4-hydroxybenzoic acid described in JP-A No. 4-226455, methacryloxyethyl ester and acryloxyethyl ester of hydroxy group-containing benzoic acid described in JP-A No. 63-173682, ester of hydroxy group-containing benzoic acid and hydroxymethylstyrene described in JP-A Nos. 59-83693, 60-141587, 62-99190, hydroxystyrene described in EU Patent No. 29323, N-vinylimidazole-zinc halide complexes described in JP-A Nos. 62-167077, 62-16708, and electron-accepting compounds described in JP-A No. 63-317558.

Among these compounds having an electron-accepting group and a polymerizable group in a molecule, 3-halo-4-hydroxybenzoic acid represented by the following general formula is preferable.

$$\text{HO}\underset{Z}{\overset{X}{-\bigcirc-}}\text{COOY}$$

(In the formula, X represents a halogen atom and above all, preferably chlorine atom; Y represents a monovalent group having polymerizable ethylene group and preferably a vinyl group-containing aralkyl group, an acryloyloxyalkyl group, or a methacryloyloxyalkyl group, and more preferably an acryloyloxyalkyl group of 5 to 11 carbon atoms or a methacryloyloxyalkyl group of 6 to 12 carbon atoms; and Z represents hydrogen atom, an alkyl group or an alkoxyl group.)

Examples of the polymerizable group-containing electron-accepting compounds (examples of 3-halo-4- hydroxybenzoic acid and other compounds) include those exemplified in paragraphs from No. [0082] to No. [0087] of the above-described Japanese Patent Application No. 11-36308.

The above-described polymerizable group-containing electron-accepting compound may be used in combination with the above-described electron-donating colorless dye.

In such a case, the electron-accepting compound is used in range of preferably from 0.5 to 20 parts by weight, more preferably from 3 to 10 parts by weight to 1 part by weight of the electron-donating colorless dye to be used. If it is less than 0.5 parts by weight, sufficient coloring density cannot be obtained and if it is more than 20 parts by weight, the sensitivity is sometimes decreased or coating ability is deteriorated.

In the case of using such an electron-donating colorless dye and such an electron-accepting compound as coloring components, in order to obtain a predetermined maximum coloring density, the types of the electron-donating colorless dyes and electron-accepting compounds are properly selected and the coating amount of a recording layer to be formed is properly adjusted.

Further, as the coupler compounds having the polymerizable group to be used for a photosensitive and heat sensitive recording material, any compounds can be used if they are capable of forming color by reaction with a diazonium salt compound, one of coloring components and photopolymerizing to form a film.

The coupler compounds are compounds which form a coloring material by coupling with diazo compounds in basic atmosphere and/or neutral atmosphere and a plurality of types of the compounds may be used in combination depending on various purposes such as hue adjustment or the like.

Examples of the coupler compounds are those exemplified in paragraphs from No. [0090] to No. [0096] of Japanese Patent Application No. 11-36308, yet the present invention is not limited to those compounds.

The coupler compounds can be added in a range from 0.02 to 5 g/m$^2$ to a photosensitive and heat sensitive recording material and preferably in a range from 0.1 to 4 g/m$^2$ from a viewpoint of the effectiveness. If the addition amount is less than 0.02 g/m$^2$, the coloring property is deteriorated and if it is more than 5 g/m$^2$, the coating ability is deteriorated.

The coupler compounds may be used in combination of the diazonium salts. In such a case, the coupler compounds are used in a range preferably from 0.5 to 20 parts by weight, more preferably from 1 to 10 parts by weight, to 1 parts by weight of a diazonium salt. If the amount is less than 0.5 parts by weight, sufficient coloring property cannot be obtained and if it is more than 20 parts by weight, the coating ability is deteriorated.

In the case in which such a diazonium salt and such a coupler compound are used as coloring components, in order to obtain a predetermined maximum coloring density, the types of the diazonium salt and coupler compound are properly selected and the coating amount of a recording layer to be formed is properly adjusted.

The coupler compound may be solid-dispersed using a sand mill or the like by adding water-soluble polymer and other components to the coupler and used. The coupler compound may be emulsified by adding a proper emulsion and used as an emulsion. In this case, the methods for solid-phase dispersion and emulsification are not particularly restricted, and any conventionally known methods can be employed. Details of these methods are described in JP-A Nos. 59-190886, 2-141279, and 7-17145.

In the present invention, for the purpose to promote the coupling reaction, organic bases such as tertiary amines, piperidines, piperazines, amidines, formamidines, pyridines, guanidines, morpholines and the like can be employed.

They are specifically described in JP-A Nos. 57-123086, 60-49991, 60-94381, 9-71048, 9-77729, 9-77737, and the like.

The use amount of the organic bases is not particularly restricted, however it is preferably in a range from 1 to 30 mole to 1 mole of a diazonium salt.

Further, for a purpose to promote the color forming reaction, a coloring assisting agent may be added. As the coloring assisting agent, phenol derivatives, naphthol derivatives, alkoxy-substituted benzenes, alkoxy-substituted naphthalenes, hydroxy compounds, carboxylic acid amide compounds, sulfonamide compounds are usable.

These compounds have a function of decreasing the melting point of the coupler compounds or basic substances or improving the heat transmissivity of the microcapsule walls, so that they are supposed to make it possible to obtain a high coloring density.

-Compound (ii)-

As the compound (ii), those suitable for the compounds to be employed, in other words, specified photopolymerizable monomer ($D^1$, $D^2$), may be used. In the case of using a substantially colorless compound having no polymerizable group and capable of forming color by reaction with a coloring component, since the compound has no polymerizable group, a recording layer is required to be provided with a film curing function and a substantially colorless compound (ii) having a polymerizable group and a site to suppress the reaction of a coloring component and other compound in a molecule is used in combination.

As the substantially colorless compound having no polymerizable group and capable of forming color by reaction with a coloring component, any electron-accepting compound or coupler compound having no polymerizable group can be used. As the electron-accepting compound having no polymerizable group, any compounds can be used if they are capable of forming color by reaction with an electron-donating colorless dye, one of coloring components.

In the case of using such an electron-accepting compound having no polmerizable group, a specific photopolymerizable monomer $D^1$ is used in combination, and as the photopolymerizable monomer $D^1$ a photopolymerizable monomer suppressing reaction between the electron-donating colorless dye and the electron-accepting compound and containing at least one vinyl group in a molecule is preferable.

More specfically, examples thereof are acrylic acid and its salts, acrylic acid esters, acrylamides; methacrylic acid and its salts, methacrylic acid esters, methacrylamides; maleic anhydride, maleic acid esters; itaconic acid, itaconic acid esters; styrenes; vinyl ethers; vinyl esters; N-vinylheterocyclic compounds; aryl ethers; allyl esters and the like.

Among them, especially, photopolymerizable monomers having a plurality of vinyl groups in a molecule are preferably used and the examples threreof include; acrylic acid esters or methacrylic acid esters of polyhydric alcohols such as trimethylolpropane, pentaerythritol, and the like; acrylic acid esters or methacrylic acid esters of polyhydric phenols and bisphenols such as resorcinol, pyrogallol, phloroglucinol, and the like; acrylate- or methacrylate-terminated epoxy resin, acrylate- or methacrylate-terminated polyesters, and the like.

Among them, especially preferable compounds are ethylene glycol diacrylate, ethylene glycol dimethacrylate, trimethylolpropane triacrylate, pentaerythritol tetraacrylate, dipenthaerythritol hydroxypentaacrylate, hexane-1,6-diol dimethacrylate, and diethylene glycol dimethacrylate.

The molecular weight of the photopolymerizable monomer $D^1$ is preferably about 100 to 5,000, and more preferably about 300 to 2,000.

The photopolymerizable monomer $D^1$ is used in a range preferably from 0.1 to 10 parts by weight, more preferably from 0.5 to 5 parts by weight, to 1 part by weight of the substantially colorless compound capable of forming color by reaction with the coloring component. If the amount is less than 0.1 parts by weight, no latent image can be formed in the exposure process and if it is more than 10 parts by weight, the coloring density is decreased.

In the case the coupler compounds having no polymerizable group are used, a specific photopolymerizable monomer $D^2$ is employed in combination, and the photopolymerizable monomer $D^2$ is preferably a photopolymerizable monomer which contains an acidic group having a coupling reaction suppressing effect and is not a metal salt.

As the photopolymerizable monomer $D^2$, for example, those described in paragraphs No. from [0128] to [0130] of the Japanese Patent Application No. 11-36308 can be exemplified.

The photopolymerizable monomer $D^2$ is used in a range preferably from 0.1 to 10 parts by weight, more preferably from 0.5 to 5 parts by weight, to 1 part by weight of the substantially colorless compound capable of forming color by reaction with the coloring component. If the amount is less than 0.1 parts by weight, no latent image can be formed in the exposure process and if it is more than 10 parts by weight, the coloring density is decreased.

<Recording Material>

Next, a recording material of the present invention will be described. The recording material of the present invention comprises a recording layer on a support and the recording layer contains a photopolymerizable composition of the present invention.

A recording material in which a photopolymerizable composition of the present invention is preferably used is a photosensitive and heat sensitive recording material comprising a photosensitive and heat sensitive recording layer on a support or a photosensitive and pressure sensitive recording material comprising a photosensitive and pressure sensitive recording layer on a support. Examples of the basic constitution of the material include the following (a) to (c): a recording material (a) is a heat sensitive recording material comprising a photosensitive and heat sensitive recording layer of a photopolymerizable composition on a support, wherein the photopolymerizable composition contains heat responsive microcapsules encapsulating a coloring component A and, outside the microcapsules, a substantially colorless compound B having at least a polymerizable group and a site capable of forming color by reaction with the coloring component A in a molecule, a photo-radical-generating agent, and an amine compound: a recording material (b) is a photosensitive and heat sensitive recording material comprising a photosensitive and heat sensitive recording layer of a photopolymerizable composition on a support, wherein the photopolymerizable composition contains heat responsive microcapsules encapsulating a coloring component A and, outside the microcapsules, at least a substantially colorless compound C capable of firming color by reaction with the coloring component A, a substantially colorless compound D having a polymerizable group and a site capable of suppressing reaction of the coloring component A with the compound C in a molecule, a photo-radical- generating agent, and an amine compound: and a recording material (c) is a photosensitive and pressure sensitive recording material comprising a photosensitive and pressure sensitive recording layer on a support, wherein the photosensitive and pressure sensitive recording layer contains microcapsules encapsulating a photopolymerizable composition containing at least a coloring component A, a polymerizable compound, a photo-radical-generating agent, and an amine compound and, outside the microcapsules, at least a substantially colorless compound E capable of forming color by reaction with the coloring component A.

Further, the above-described recording materials can have one or more of such a photosensitive and heat sensitive recording layer and such a photosensitive and pressure sensitive recording layer.

In the photosensitive and heat sensitive recording material (a), the photopolymerizable composition outside the microcapsules causes polymerization reaction by a radical which is generated from the photo-radical-generating agent by imagewise exposing the material to light and is cured to form a latent image with the desired image shape. At that time, due to the improvement of the polymerization sensitivity by the amine compound, formation of the latent image with weak light is made possible and the raw storage property becomes good. Next, the compound B existing in the unexposed areas is transported in the recording material by heating and reacted with the coloring component A in the capsules to from color.

Consequently, the photosensitive and heat sensitive recording material (a) is a positive type recording material in which color is not fromed in the exposed areas and is formed in the uncured parts, which are unexposed areas.

The photosensitive and heat sensitive recording material (b) is imagewise exposed to light and the compound D having a polymerizable group causes polymerization reaction by a radical generated by reaction of the photopolymerization initiator and is cured to form a latent image with the desired image shape. At that time, due to the improvement of the polymerization sensitivity by the amine compound, formation of the latent image with weak light is made possible and the raw storage property becomes good. Depending on the film property of the latent image (the cured parts), the compound C is transported and reacted with the coloring component A in the capsules to form an image.

Consequently, the photosensitive and heat sensitive recording material (b) is a negative type recording material in which color is formed in the exposed areas.

In the photosensitive and pressure sensitive recording material (c), the photopolymerizable compound contained in the microcapsules causes polymerization reaction due to a radical which is generated by reaction of the photo-radical-generating agent existing together in the capsules by iamgewise exposing the material to light and is cured in capsule to form a latent image with the desired image shape. At that time, due to the improvement of the polymerization sensitivity by the amine compound, formation of the latent image with weak light is made possible and the raw storage property becomes good. Due to the formation of the latent image, in the exposed areas, color forming reaction with the compound C existing outside the capsules is suppressed and the compound C existing in the unexposed areas is transported in the recording material by pressure application and reacted with the coloring component A in the capsules to form color.

Consequently, the photosensitive and heat sensitive recording material (c) is a positive type recording material in which color is not formed in the exposed areas and is formed in the uncured parts, which are unexposed areas.

Further, the recording material of the present invention can have a plurality of the photosensitive and heat sensitive recording layers or the photosensitive and pressure sensitive recording layers on a support. In this case, a plurality of respectively monochromatic recording layers each containing microcapsules encapsulating each coloring component A which forms different hue are layered and light rays are radiated from a plurality of light sources having respectively different wavelength ranges to obtain a multi-color image.

As specific embodiments of the above-described recording material, the following recording materials (1) to (3) can be exemplified.

The recording material (1) is a positive type photosensitive and heat sensitive recording material described in JP-A No. 3-87827 and comprising photosensitive and heat sensitive recording layers each composed of, outside microcapsules, a photo-curable composition containing a compound having an electron-accepting group and a polymerizable compound in a molecule, a photo-radical-generating agent, and an amine compound and an electron-donating colorless coloring material encapsulated in the microcapsules.

In the photosensitive and heat sensitive recording material (1), the photo-curable composition existing outside the microcapsules is polymerized and cured by exposing the material to light so as to form a latent image. After that, the electron-accepting compound in the unexposed areas is transported in the recording material by heating and reacted with the electron-donating colorless coloring material in the capsules to form color. Consequently, color is not formed in the cured exposed areas of the latent image and is formed only in the uncured parts and then a positive image with a high contrast and clearness is formed.

The recording material (2) is a negative type photosensitive and heat sensitive recording material described in JP-A No. 4-211252 and comprising photosensitive and heat sensitive recording layers each composed of, outside microcapsules, an electron-accepting compound, a polymerizable vinyl monomer, a photo-radical-generating agent, and an amine compound and an electron-donating colorless coloring material encapsulated in the microcapsules.

The mechanism is not made clear, yet it is supposed as follows. The vinyl monomer existing outside the microcapsules is polymerized by exposing the material to light, whereas the electron-accepting compound coexisting in the exposed parts is not at all taken in the polymer and rather exists in a state in which the electron-accepting compound can more at a high diffusion speed due to the decreased mutual reaction with the vinyl monomer.

On the other hand, the electron-accepting compound in the unexposed areas is trapped with the coexisting vinyl monomer, so that at the time of heating, the electron-accepting compound in the exposed areas is transported in the recording material and reacted with the electron-donating colorless coloring material in the microcapsules, whereas the electron-accepting compound in the unexposed areas cannot pass through the capsule wall even by heating, is not reacted with the electron-donating colorless coloring material, and thus cannot contribute to color formation. Consequently, in this photosensitive and heat sensitive recording material, color is formed in the exposed areas but not formed in the unexposed areas and a negative image with a high contrast and sharpness can be formed.

The recording material (3) is a positive type photosensitive and pressure sensitive recording material described in U.S. Pat. No. 4,399,209 and comprising photosensitive and pressure sensitive recording layers each composed of, outside microcapsules, a developer and microcapsules encapsulating a photo-curable composition and a coloring material precursor.

In such a photosensitive and pressure sensitive recording material, the photo-curable composition existing in the inside of the microcapsules is cured by exposing the material to light so as to form a latent image. After that, the developer existing in the unexposed areas is transported in the recording material by pressure application and reacted with the coloring precursor in the capsules to form color. Consequently, color is not formed in the exposed and cured areas of the latent image and is formed only in the uncured parts and a positive image with a high contrast and clearness is formed.

As the coloring component A encapsulated in the microcapsules in a recording layer, substantially colorless electron-donating dyes or diazonium salt compounds can be exemplified.

As the above-described electron-donating colorless dyes, conventionally known compounds can be used, and any compounds can be used if they can be reacted with the compound B, compound C or compound E to form color.

Examples of these coloring components include compounds described in Japanese Patent Application No. 11-36308 and, for example, the electron-donating compounds are described in paragraphs No. [0051] to No. [0059] of the same patent specification and in the case of using the recording material of the present invention as a multi-color recording material, the electron-donating colorless dyes to be used in combination with cyan, magenta, or yellow color forming compound are disclosed in paragraphs No. [0060] of the same patent specification.

The above-described electron-donating colorless dyes are preferably used in an amount of from 0.1 to 1 g/m$^2$, more preferably from 0.1 to 0.5 g/m$^2$ in the photosensitive and heat sensitive recording layer. If the use amount is less than 0.1 g/m$^2$, sufficient coloring density cannot be obtained and if it is more than 1 g/m$^2$, the coating ability is deteriorated.

In the case of a multilayer recording material, a plurality of recording layers containing the electron-donating colorless dyes in the above-described amount are layered.

As the examples of the diazonium salt, compounds having the following formula can be exemplified.

(In the formula, Ar represents an aromatic cyclic group, and X$^-$ represents an acid anion.)

Such a diazonium salt is a compound capable of causing coupling reaction with a coupler by heating to form color and decomposable by light. In the compound it is possible to control the maximum absorption wavelength by adjusting the position and the type of a substituent group in the Ar portion.

In the formula, Ar represents a substituted or unsubstituted aryl group and as the substituent group and the aryl group, those described in paragraphs No. [0064] to [0067] of the Japanese Patent Application No. 11-36308 specification can be employed.

The maximum absorption wavelength λmax of the diazonium salt to be employed in the present invention is preferably 450 nm or less in view of the effectiveness and more preferably from 290 to 440 nm. Further, the diazonium salt to be employed in the present invention preferaby has 12 carbon atoms or more, a solubility in water of 1% or lower, and a solubility in ethyl acetate of 5% or higher.

Examples of the diazonium salt to be used preferably in the recording material of the present invention include those disclosed in paragraphs No. [0064] to [0075] of Japanese Patent Application No. 11-36308, yet the diazonium salt is not limited to those compounds.

In the present invention, the diazonium salt may be used alone or two or more diazonium salts may be used in combination depending on the purposes such as hue adjustment.

The diazonium salt is preferably used in an amount of from 0.01 to 3 $g/m^2$, more preferably from 0.02 to 1.0 $g/m^2$, in the photosensitive and heat sensitive recording layer. If the amount is less than 0.01 $g/m^2$, sufficient coloring property cannot be obtained and if it is more than 3 $g/m^2$, the sensitivity is decreased and the fixation time is required to be prolonged.

As the substantially colorless compound B employed in the photosensitive and heat sensitive recording layer and having a polymerizable group and a site capable of forming color by reaction with the coloring component A in a molecule, those same as the above described compound (i) can be used and any compounds can be used if they have both functions; forming color by reaction with the coloring component A such as an electron-accepting compound having a polymerizable group and a coupler compound having a polymerizable group, and polymerizing and curing by photoreaction.

Further, in the present invention, as a compound which form color by reaction with the coloring component A, in place of the compound B having polymerizable group as described above, a substantially colorless compound C having no polymerizable group and forming color by reaction with the coloring component A may be used.

Since the compound C does not have a polymerizable group and it is required to provide the recording layer with a film curing function by photopolymerization, another compound D having a polymerizable group is used in combination. The compound D is selected depending on the type of the above-described compound C to be employed and a specified photopolymerizable monomer (the above-described photopolymerizable monomers $D^1$, $D^2$) is employed.

As the compound C, any electron-accepting compounds or coupler compounds having no polymerizable group can be used.

As the electron-accepting compound having no polymerizable group, any compounds can be employed if they can be reacted with the electron-donating colorless dye, one of examples of the coloring component A, and forming color.

As the electron-accepting compound having no polymerizable group, for example, phenol derivatives, salicylic acid derivatives, metal salts of aromatic carboxylic acid, acid clay, bentonite, novolak resin, metal-treated novolak resin, metal complexes and the like can be exemplified.

More specifically, they are the compounds described in JP-B Nos. 40-9309, 45-14039, JP-A Nos. 52-140483, 48-51510, 57-210886, 58-87089, 59-11286, 60-176795, 61-95988 and the like.

Moreover, compounds are exemplified in paragraphs No. [0109] to [0110] of Japanese Patent Application No. 11-36308 can be used.

In the case of using the electron-accepting compound having no polymerizable group, it is preferable to use it in an amount of from 5 to 1,000% by weight to the use amount of the electron-donating colorless dye to be employed.

In the case of using the an electron-accepting compound having no polymerizable group, the compound D, that is, a specific photopolymerizable monomer $D^1$ is used in combination and the photopolymerizable monomer $D^1$ is previously described.

As the coupler compound having no polymerizable group, any compounds can be used if they can be reacted with a diazonium salt compound, one of the examples of the coloring component A, to form color.

The coupler compound having no polymerizable group is a compound capable of coupling with a diazonium compound in basic atmosphere and/or neutral atmosphere to form a dye and a plurality of types of coupler compounds may be used in combination depending on various purposes such as hue adjustment or the like.

As the coupler compound having no polymerizable group, so-called active methylene compounds having methylene group adjacent to carbonyl group, phenol derivatives, naphthol derivatives, and the like can be exemplified, and they are properly selected and used depending on the purposes of the present invention.

As the coupler compound having no polymerizable group, those described in paragraphs No. from [0119] to [0121] of the Japanese Patent Application No. 11-36308 can be exemplified.

Details of the coupler compound having no polymerizable group are described in JP-A Nos. 4-201483, 7-223367, 7-223368, 7-323660, 5-278608, 5-297024, 6-18669, 6-18670, 7-316280; Japanese Patent Application Nos. 8-12610, 8-30799, JP-A Nos. 9-216468, 9-216469, 9-319025, 10-35113, 10-193801, and 10-264532.

Similarly to the coupler compound having a polymerizable group, the coupler compound having no polymerizable group is preferably used in an amount of from 0.02 to 5 $g/m^2$, more preferably from 0.1 to 4 $g/m^2$, in terms of the effectiveness. If the addition amount is less than 0.02 $g/m^2$, sufficient coloring density cannot be obtained and if it is more than 5 $g/m^2$, the coating ability is deteriorated.

The coupler compounds may be used while being mixed with a water-soluble polymer and other components and solid-dispersed by a sand mill or the like, and also they may be used as emulsions while being emulsified with a proper emulsion assisting agent. In this case, the methods for solid-dispersion and emulsification are not particularly restricted, and any conventionally known methods can be employed. Details of these methods are described in JP-A Nos. 59-190886, 2-141279, and 7-17145.

Further, for the purpose to promote the coupling reaction, organic bases such as tertiary amines, piperidines, piperazines, amidines, formamidines, pyridines, guanidines, morpholines and the like can be employed.

Examples of the organic bases to be employed and the amount thereof in this case are already described above.

Further, for the purpose to promote the coloring reaction, as regards the coloring assisting agent, those same as described above can be used.

In the case of using the coupler compound having no polymerizable group, a compound D, that is, a specific photopolymerizable monomer $D^2$ is used in combination, and the photopolymerizable monomer $D^2$ is already described above.

As the substantially colorless compound E which is used in a photosensitive and pressure sensitive recording layer and which is reacted with the coloring component A to form color, those having a polymerizable group or having no polymerizable group may be employed if they are capable of being reacted with the coloring component A to form color. For example, as described above, those similar to the electron-accepting compounds and coupler compounds exemplified as the compound B having a polymerizable group and the compound C having no polymerizable group can be used.

The recording material of the present invention is not limited to the above-described photosensitive and heat sensitive recording materials (a) to (c) and may have a variety of constitutions depending on the purposes described above.

(Protection Layer)

Further, the recording material of the present invention may have a protection layer, if necessary. The protection layer is preferably formed as the outermost layer of a multi-color multilayered recording material, at the light impingent side thereof.

The protection layer may have a single layer structure or a multilayer structure of two or more layers.

The materials to be employed for the above-described protection layer are, for example, water-soluble polymer compounds such as gelatin, polyinyl alcohol, carboxy-modified polyinyl alcohol, vinyl acetate-acrylamide copolymer, silicon-modified polyinyl alcohol, starch, modified starch, methyl cellulose, carboxymethyl cellulose, hydroxymethyl cellulose, gelatins, gum arabic, casein, styrene-maleic acid copolymer hydrolysate, styrene-maleic acid copolymer half ester hydrolysate, isobutylene-maleic anhydride copolymer hydrolysate, polyacrylamide derivatives, polyinylpyrrolidone, sodium polystyrenesulfonate, sodium alginate and the like; and latexes such as styrene-butadiene rubber latex, acrylonitrile-butadiene rubber latex, methyl acrylate-butadiene rubber latex, vinyl acetate emulsion, and the like.

By cross-linking a water-soluble polymer compound to be used for the above-described protection layer, the storage stability can further be improved. In this case, as a cross-linking agent to be use for the cross-linking, known cross-linking agents may be used, and specifically, they are water-soluble initial condensates such as N-methylol urea, N-methylolmelamine, urea-formalin and the like; dialdehyde compounds such as glyoxal, glutaraldehyde and the like; inorganic cross-linking agents such as boric acid, borax and the like; and polyamidoepichlorohydrin and the like.

For the above-described protective layer, further, known pigment, metal soap, wax, a surfactant and the like may be used and also a known UV absorber and a UV absorber precursor may be added.

The coating amount of the protective layer is preferably 0.2 to 5 g/m$^2$, more preferably 0.5 to 3 g/m$^2$.

(Multi-color Recording Material)

In the case of a multi-color recording material, a plurality of monochromatic recording layers are laminated on a support and each recording layer contains microcapsules containing a coloring component with different hue from that of other layers and a photopolymerizable composition sensitive to light with wavelength different from that of other layers. By using an organic dye or another spectral sensitizing compound with different absorption wavelength from one another, photopolymerizable compositions sensitive to different wavelength from that of others can be obtained. In this case, intermediate layers may be formed between respective photosensitive and heat sensitive recording layers which form different colors.

The photosensitive and heat sensitive recording layers and photosensitive and pressure sensitive recording layers of a multi-color multilayered recording material of the present invention can be formed, for example, by the following method.

That is, the photosensitive and heat sensitive recording layers and photosensitive and pressure sensitive recording layers in the present invention are obtained by forming a first recording layer composed of microcapsules containing a yellow-color forming component and a photopolymerizable composition sensitive to light rays with central wavelength $\lambda_1$ of a light source on a support; forming a second recording layer composed of microcapsules containing a magenta-color forming component and a photopolymerizable composition sensitive to light rays with central wavelength $\lambda_2$ on the first layer; and forming a third recording layer composed of microcapsules containing a cyan-color forming component and a photopolymerizable composition sensitive to light rays with central wavelength $\lambda_3$ on the second layer. Further, if necessary, a protective layer and intermediate layers may be formed between respective recording layers. The central wavelength $\lambda_1$, $\lambda_2$, $\lambda_3$ of the respective light sources differs from one another.

In the case of forming an image using such a multi-color recording material comprising recording layers to be employed in the present invention, by imagewise exposing the material using a plurality of light sources with different wavelength corresponding to the absorption wavelength of each recording layer in the exposure process, the respective recording layers having absorption wavelength of the corresponding light sources selectively and respectively form latent images, so that a multi-color image with a high sensitivity and a high sharpness can be formed and after that, by radiating light to the surface of the recording layers, coloration of the background texture parts due to the photopolymerization initiators such as spectral sensitizing compounds remaining in the layers can be decolored to result in formation of a high quality image having a high contrast.

In the recording material of the present invention, an electron-donating colorless dye or a diazonium salt compound to be employed is encapsulated in microcapsules for the use. The method to be employed for encapsulating them may be conventional known method.

For example, methods utilizing a coacervation of a hydrophilic wall-forming material as described in U.S. Pat. Nos. 2,800,457 and also 2,800,458; interfacial polymerization methods described in U.S. Pat. No. 3,287,154, British Patent No. 990443, JP-B Nos. 38-19574 and 42-446 and 42-771; method by polymer precipitation described in U.S. Pat. Nos. 3,418,250, 3,660,304; methods using isocyanate polyol wall materials as described in U.S. Pat. No. 3,796,669; methods using isocyanate wall materials as described in U.S. Pat. No. 3,914,511; methods using urea-formaldehyde-based or urea-formaldehyde-resorcinol-based wall forming materials as described in U.S. Pat. Nos. 4,001,140, 4,087,376, and 4,089, 802; methods using wall forming materials such as melamine-formaldehyde resin, hydroxypropyl cellulose and the like as described in U.S. Pat. No. 4,025,455; in situ methods by monomer polymerization as described in JP-B No. 36-9168 and JP-A No. 51-9079; electrolytic dispersion cooling method as described in British Patent No. 952807, 965074; spray drying methods described in U.S. Pat. No. 3,111,407, British Patent No. 930422; and the like can be exemplified.

The microencapsulating methods are not restricted to these method, yet in the recording material of the present invention, especially, it is preferable to employ an interfacial polymerization method comprising steps of mixing an oil phase produced by dissolving or dispersing a coloring component in a hydrophobic organic solvent to be a core of capsule with a water phase dissolving a water-soluble polymer, emulsifying and dispersing the mixture with means such as a homogenizer and the like, and then heating the mixture to cause polymer formation reaction in the interface of the oil droplets and to form microcapsule wall of the resulting polymer substance.

That is, a capsule with an even particle size can be formed within a short time to give a recording material with an excellent raw storage property.

The reactant to form the polymer is added to the insides of the oil droplets and/or to the outside of the oil droplets. Specific examples of the polymer substance are polyurethanes, polyureas, polyamides, polyesters, polycarbonates, urea-formaldehyde resin, melamine resin, polystyrene, styrene-methacrylate copolymers, styrene-acrylate copolymers and the like. Among them, polyurethanes, polyureas, polyamides, polyesters, and polycarbonates are preferable and polyurethanes and polyureas are especially preferable. The above-described polymer substances may be used in combination of two or more of them.

As the water-soluble polymer, for example, gelatin, polyinylpyrrolidone, polyinyl alcohol and the like can be exemplified.

For example, in the case of using a polyurethane as a capsule wall material, a polyalent isocyanate and a second substance (e.g. polyols, polyamines and the like) which reacts with on the isocyanate to form the capsules wall are mixed with an aqueous water-soluble polymer solution (water phase) or with an oil medium (oil phase); the mixture is emulsified or dispersed and then heated to cause polymer formation reaction in the oil droplet interface and form the microcapsule wall.

As the polyalent isocyanate and polyols and polyamines, to be reacted with the isocyanate, those described in U.S. Pat. Nos. 3,281,383, 37,773,695, 3,793,268, JP-B Nos. 48-40347, 49-24159, JP-A Nos. 48-80191, 48-84086 can be used.

In the present invention, at the time of producing the microcapsules containing a coloring component, the coloring component to be encapsulated may exist in a solution state and also in solid-state in the capsules.

As the solvent, solvents similar to those to be employed in the case of emulsifying and dispersing the photo curable composition can be employed.

In the case in which an electron-donating colorless dye or a diazonium salt compound is encapsulated in a solution state in the capsules, the electron-donating colorless dye or diazonium salt compound may be encapsulated while being dissolved in a solvent, and in this case, the solvent is preferably used in an amount ranging from 1 to 500 parts by weight to 100 parts by weight of the electron-donating colorless dye.

Further, in the case the solubility of the electron-donating colorless dye or the diazonium salt compound to the above-described solvent is low, a low boiling point solvent to which the electron-donating colorless dye or the diazonium salt has a high solubility may be used together. As the low boiling point solvent, for example, ethyl acetate, propyl acetate, isopropyl acetate, butyl acetate, methylene chloride and the like can be exemplified.

On the other hand, for the water phase to be used, an aqueous solution in which a water-soluble polymer is dissolved is used and after addition of the above-described oil phase to the solution, emulsification and dispersion is carried out by means such as a homogenizer and the like, the water-soluble polymer works as a dispersant to evenly and easily carry out the dispersion and at the same time to stabilize the emulsified and dispersed aqueous solution. Here, in order to further evenly carry out emulsification and dispersion and stabilize the resulting emulsion, a surfactant may be added at least one of the oil phase and the water phase. As the surfactant, known surfactants for emulsification can be used. Also, in the case of adding the surfactant, the addition amount of the surfactant is preferably 0.1 to 5%, especially preferably 0.5 to 2% to the weight of the oil phase.

Further, the surfactant to be contained in the water phase, those which do not precipitate or coagulate by reaction with the protective colloid are properly selected among anionic or nonionic surfactants and used.

Preferable surfactants are, for example, sodium alkylbenzenesulfonate, alkylsulfate, dioctyl sodium sulfosuccinate, polyalkylene glycol (e.g. polyoxyethylene nonylphenyl ether) and the like.

As described above, the water soluble polymer to be added as a protective colloid to the water phase to which the oil phase is added may properly selected from known anionic polymers, nonionic polymers, and amphoteric polymers.

As the anionic polymer, both natural and synthetic ones can be used and those having —COO—, —SO$_2$— group can be exemplified.

More specifically, natural compounds such as gum arabic, aluginic acid, pectin, and the like; semi-synthetic products such as gelatin derivatives such as carboxymethyl cellulose, phthalated gelatin; sulfated starch, sulfated cellulose, lign-insulfonic acid and the like; and synthetic products such as maleic anhydride-based (including hydrolyzed products) copolymers, acrylic acid-based (methacrylic acid-based) polymers and copolymers, benzenesulfonic acid-based polymers and copolymers; carboxy-modified polyinyl alcohol and the like.

As the nonionic polymers, polyinyl alcohol, hydroxyethyl cellulose, methyl cellulose and the like can be exemplified.

As the amphoteric polymers, gelatin can be exemplified. Among them, gelatin, gelatin derivatives, and polyinyl alcohol are preferable.

The above-described water soluble polymers may be used as an aqueous solution in 0.01 to 10% by weight concentration.

All of the components such as the coloring component to be added to the recording layer of the present invention may be used, together with, for example, a water-soluble polymer, a sensitizer, and other coloring assisting agents, while being solid-dispersed by means by a sand mill or the like, yet it is preferable for them to be used as an emulsion or dispersion by dissolving them in a hardly soluble-in-water or water-insoluble high boiling point organic solvent and mixing the resultant solution with an aqueous polymer solution (water phase) containing a surfactant and/or a water-soluble polymer as the protective colloid and emulsifying the resulting mixture by a homogenizer or the like. In this case, if necessary, a low boiling point solvent may be used as a dissolution assisting agent.

Further, all of the components such as the coloring component may separately be emulsified and dispersed or previously mixed them and dissolving the mixture with a high boiling point solvent and then emulsified and dispersed. The preferable emulsified and dispersed particle diameter is 1 $\mu$m or smaller.

The emulsification of the oil phase containing the above-described components and the water phase containing the protective colloid and the surfactant can be carried out by common means such as a high speed stirring, ultrasonic dispersing means and the like to be employed for fine particle emulsification and for example, well-known emulsifying apparatuses such as a homogenizer, a Manton Gaulin, a ultrasonic dispersing apparatus, a dissolver, a KADY mill and the like are used to easily carry out the emulsification.

After the emulsification, in order to promote the capsules wall formation reaction, the resulting emulsion is heated to 30 to 70° C. Further, in order to prevent agglomeration of capsules during the reaction, it is required to add water to lower the probability of the collision between the capsules or sufficiently stir the emulsion.

Further, a dispersant for preventing agglomeration may supplementarily be added during the reaction. Carbon dioxide gas evolution along with the proceeding of the polymerization reaction is observed and the end of the evolution can be regarded as the completion of the capsules wall formation reaction. Generally, the reaction for several hours makes it possible to obtain aimed microcapsules encapsulating the coloring component.

The average particle size of the microcapsules to be employed for the recording material of the present invention is preferably 20 $\mu$m or smaller, more preferably 5 $\mu$m or smaller from a viewpoint of obtaining high resolution. If the size of the produced microcapsule is too small, the surface area per a predetermined amount of solid matter becomes high and a large quantity of the wall agent is required and therefore, the average particle size is preferably 0.1 $\mu$m or larger.

In the case in which the recording material of the present invention is used as a multi-color recording material, the photosensitive and heat sensitive recording layers or photosensitive and pressure sensitive recording layers of the recording material are laminated on a support and each recording layer contains microcapsules containing an electron-donating colorless dye or a diazonium salt compound which form color different from that of other layers and a photopolymerizable composition containing an organic dye with the maximum absorption wavelength different from that of organic dye in other layers and other spectral sensitizing compound. The recording layers are exposed to light of the light sources to form a multi-color image.

(Intermediate Layer)

Further, intermediate layers may be formed between the monochromic photosensitive and heat sensitive recording layers or photosensitive and pressure sensitive recording layers. Each intermediate layer contains mainly a binder and if necessary, it may further contain additives such as a curing agent, polymer latex and the like.

In the recording material of the present invention, the binder to be used in the protective layer, the photosensitive and heat sensitive recording layer or photosensitive and pressure sensitive recording layer, and the intermediate layer may be similar to a binder to be used for emulsification and dispersion of the above-described photopolymerizable composition. In addition to the water-soluble polymer to be employed for encapsulating the coloring components, solvent-soluble polymers such as polystyrene, polyinyl formal, polyinyl butyral, acrylic resin such as polymethyl acrylate, polybutyl acrylate, polymethyl methacrylate, polybutyl methacrylate, and their copolymers, phenol resin, styrene-butadiene resin, ethyl cellulose, epoxy resin, urethane resin, and the like; and their polymer latex may be employed.

Among them, gelatin and polyinyl alcohol are preferable.
(Others)

In the respective recording layers composing the recording material of the present invention, a variety of surfactants may be used for various purposes such as a coating assisting agent, antistatic property, slipping property improvement, emulsification and dispersion, adhesion prevention and the like.

As the surfactants, for example, the following surfactants are usable; nonionic surfactants such as saponin, polyethylene oxide, polyethylene oxide derivatives such as alkyl ether of polyethylene oxide; anionic surfactants such as alkylsulfonates, alkylbenzenesulfonates, alkylnaphthalenesulfonates, alkylsulfuric acid ester, N-acyl-N-alkyltaurines, sulfosuccinic acid esters, sulfoalkylpolyoxyethylene alkylphenyl ethers and the like; amphoteric surfactants such as alkylbetains, alkylsulfobetains and the like; and cationic surfactants such as aliphatic or aromatic quaternary ammonium salts.

Further, in the recording layers, in addition to the additives described before, other additives may be added if necessary.

For example, dyes, ultraviolet absorbents, plasticizers, fluorescent whitening agents, matting agents, coating assisting agents, curing agents, antistatic agents, slip improvers and the like may be added.

The typical examples of the above-described respective additives are described in "Research Disclosure Vol. 176", Item 17643, December 1978 and Vol. 187, Item 18716, November 1979.

In the recording material of the present invention, a curing agent may be added to the photosensitive and heat sensitive recording layer or photosensitive and pressure sensitive recording layer, the intermediate layer, and the protective layer, if necessary.

In particular, the curing agent is preferably used in the protective layer to lower the adhesion property of the protective layer. As the curing agent, "a gelatin curing agent" to be employed for production of, for example, photographic photosensitive materials is useful and, for example, the following compound are usable; aldehyde-type compounds such as formaldehyde, glutaldehyde and the like; reactive halogen compounds described in U.S. Pat. No. 3,635,718; reactive ethylenic unsaturated group-containing compounds described in U.S. Pat. No. 3,635,718; aziridine-type compounds described in U.S. Pat. No. 3,017,280; epoxy-type compounds described in U.S. Pat. No. 3,091,537; halogenocarboxyaldehydes such as mucochloric acid and the like; dioxanes such as dihydroxydioxane, dichlorodioxane and the like; vinylsulfones described in U.S. Pat. Nos. 3,642,486, 3,687,707; vinylsulfone precursors described in U.S. Pat. No. 3,841,872; and ketovinyls described in U.S. Pat. No. 3,640,720, and further, as an inorganic curing agent, chromium alum, zirconium sulfate, boric acid and the like can be used.

Among them, especially preferable compounds are 1,3,5-triacryloyl-hexahydro-s-triazine, 1,2-bis(vinylsulfonyl)methane, 1,3-bis(vinylsulfonylmethyl)propan-2-ol, bis($\alpha$-vinylsulfonylacetamido)ethane sodium salt of 2,4-dichloro-6-hydroxy-s-triazine, 2,4,6-triethyleneimino-s-triazine, and boric acid.

The curing agent is preferably added in an amount of from 0.5 to 5% by weight to the use amount of a binder.

The recording material of the present invention can be obtained by dissolving respective constituent components, if necessary, in solvents to prepare a coating solution for the photosensitive and heat sensitive recording layer, a coating solution for the photosensitive and pressure sensitive recording layer, a coating solution for the protective layer and the like and then applying these coating solutions to a desired support, and drying the resulting layers.

Solvents usable for preparation of the coating solutions can be water; alcohols such as methanol, ethanol, n-propanol, isopropanol, n-butanol, sec-butanol, methyl cellosolve, 1-methoxy-2-propanol and the like; solvents containing a halogen such as methylene chloride, ethylene chloride and the like; ketones such as acetone, cyclohexanone, methyl ethyl ketone, and the like; esters such as methyl cellosolve acetate, ethyl acetate, methyl acetate, and the like; toluene, xylene and the like and their mixtures containing two or more of them. Among them, water is especially preferable.

In order to apply the coating solution of the photosensitive and heat sensitive recording layer or the coating solution the photosensitive and pressure sensitive recording layer to a support, a blade coater, a rod coater, a knife coater, a roll doctor coater, a reverse roll coater, a transfer roll coater, a guravure coater, a kiss roll coater, a curtain coater, an extrusion coater, and the like can be employed.

As the coating methods, "Research Disclosure, Vol. 200", December 1980, Item 20036, paragraph XV refers to the methods.

The thickness of the photosensitive and heat sensitive recording layer and the photosensitive and pressure sensitive recording layer is preferably from 0.1 to 50 μm and more preferably from 5 to 35 μm.

The recording material of the present invention obtained in the manner as described above can form a multi-color image excellent in color tone, so that it can be employed for various purposes.

For example, the material can be used for a color printer, a label, a color-proof, copier, a facsimile, and a secondary master drawing and the like.

(Support)

As the support to be employed for the recording material of the present invention, the following can be employed; paper, synthetic paper such as coated paper, laminate paper; films such as a polyethylene terephthalate film, a cellulose triacetate film, a polyethylene film, a polystyrene film, a polycarbonate film; metal sheets of such as aluminum, zinc, copper; and these supports subjected to various treatments such as surface treatment, undercoating, metal evaporation and the like. Further, supports described in "Research Disclosure, Vol. 200", December 1980, Item 20036, paragraph XVII are also usable. These supports may contain a fluorescent whitening agent, a bluing dye, a pigment and the like. Further, sheets of polyurethane foams and rubber with elasticity may be used.

Further, if necessary, the surface of a support to be employed may be coated with an anti-halation layer, and the rear side may be coated with a slip layer, an antistatic layer, a curling-preventing layer, an adhesive layer or the like.

Furthermore, an adhesive layer may be formed between the support and the photosensitive and heat sensitive recording layer or between the support and photosensitive and pressure sensitive recording layer to make a product like a seal in which the support is used as a released paper.

An antihalation layer which can be bleached by light radiation or heat may be formed between the support and the photosensitive and heat sensitive recording layer or between the support and the photosensitive and pressure sensitive recording layer or, in the case of a transparent support, on the surface of the support on which surface no photosensitive and heat sensitive recording layer or photosensitive and pressure sensitive recording layer is formed, if the above-described antihalation layer is formed.

In the case in which the layer can be bleached by light radiation, for example, a combination of the above-described organic dye and organic boron compound may be used in the antihalation layer, and in the case in which the layer can be bleached by heat, a material which generate a base or nucleophilic agent by heat to bleach the coexisting organic dye may be used.

A layer containing a polymer such as gelatin, polyvinyl alcohol (PVA), and the like with a low oxygen permeability may be formed between the support and the photosensitive and heat sensitive recording layer or between the support and the photosensitive and pressure sensitive recording layer and in this case, discoloration of a formed image due to photooxidation can effectively be suppressed.

The recording material of the present invention can form an image by heating or pressurizing development treatment carried out simultaneously with or after exposure for latent image formation.

In the case in which the recording material of the present invention is a photosensitive and heat sensitive recording material, heating development or in the case in which the recording material is a photosensitive and pressure sensitive recording material, pressurizing development gives a visible image.

Conventionally known methods can be employed as the heating method for heating development and generally the heating temperature is preferably from 80 to 200° C., more preferably from 85 to 130° C. Heating duration is preferably from 3 seconds to 1 minute, more preferably from 5 seconds to 30 seconds.

After the heating development process, it is preferable to fix the formed image by exposing the recording material surface to light and also to decolor, decompose or inactivate the components such as the spectral sensitizing compound, the diazonium salt compound and the like remaining in the recording layers and possible to deteriorate the whiteness of the background texture.

By doing so, components remaining in the recording layers including the background texture (non-image areas) and possible to color the background texture can be removed and also the remaining diazonium salt compound is inactivated to suppress color forming reaction, so that the coloring density change in the image can be suppressed and the image storage property can considerably be improved.

The photosensitive and heat sensitive recording material of the present invention is applicable not only for the above-described recording method but also for well-known other recording methods.

For example, the recording material can be used for the recording method of forming an image by radiating laser beam which is to be employed for a silver halide photosensitive and heat sensitive recording material proposed by 3M Company as described in WO Patent 95/31745, for the purpose of improving the heat sensitive recording, the contrast, and the image quality using a heating apparatus such as a thermal head.

That is, in the radiation process of the laser beam at the time of latent image formation, the following steps are carried out: (1) a radiation light source capable of forming beam spot with at least one of a height and a length of 600 μm or less on an aiming object is prepared; (2) a recording material to be exposed to the light source is positioned at a predetermined position; thereafter, (3) the light source is adjusted so as to radiate beam spot with at least one of a height or a width of 250 μm or less; and (4) radiation is carried out in accordance with the image distribution in a manner that at least several beam spots radiated overlap the beam spot radiated previously to form an image.

Alternatively, a method for forming a latent image by exposing a recording material can be used which method is based on an image forming technique or the like comprising steps; (1) a light source for exposure is prepared and (2) a plurality of small areas with 600 μm or smaller in the height or the length are radiated so that at least 10% of energy required for at least one small area among the areas, in other words, at least 10% of a plurality of the small areas is overlapped with another small area.

Further, the recording material can be used for a recording method proposed by Canon Inc. and described in JP-A No. 60-195568, that is, a method of forming a high quality image and preventing light interference caused in the recording material by inclining the incidence angle of laser beam to be radiated to the recording material face and making the reflection pitches of coming-in beam in the interfaces of the photosensitive layers larger than the spot beam diameter. In this case, by controlling the energy of the laser beam to be radiated, the coloring image density can be controlled.

As a pressurizing method at the time of the pressurizing development process, methods can properly be selected from conventionally known methods and generally, a pressurizing type platen roller, a point-contact ball and the like are employed for process.

The pressure at the time of the pressurizing treatment is preferably 10 to 300 kg/cm$^2$, more preferably 130 to 200 kg/cm$^2$.

If the pressure is lower than 10 kg/cm$^2$, a sufficient coloring density cannot be obtained in some cases and if it is higher than 300 kg/cm$^2$, even the cured microcapsules are broken to result in insufficient discrimination of the image in some cases. After, the heating development process, light is radiated to the surface of the photosensitive and heat sensitive recording layer to fix the formed image and decolor, decompose or inactivate the components remaining in the recording layers.

Consequently, components remaining in the recording layers including the background texture (non-image areas) and coloring the background texture can be removed and also, in the case a diazonium salt compound is used, the remaining diazonium salt compound is inactivated to suppress color forming reaction, so that the coloring density change in the image can be suppressed and the image storage property can considerably be improved.

<Recording Method>

Next, a recording method of the present invention will be described. The recording method of the present invention comprises at least an exposure step of forming a latent image by the photopolymerizable composition by imagewise exposure on the photosensitive and heat sensitive recording material of the present invention, a color forming step of forming a visible image, by heating the recording material to cause a coloring component to form color in accordance with the latent image, and a fixation step of fixing the formed image by radiating light to the surface of the recording layer and decolor the organic dyes. The recording method in which the coloring components are caused to form color according to the latent image by applying pressure to the recording material instead of heat so as to form an image in the above-described color forming step can be applied to the photosensitive and pressure sensitive recording material.

In the exposure step, the photopolymerizable composition in layer is exposed in the image pattern corresponding to the pattern of a desired image form to form a latent image and then, in the color forming step, the surface of the recording layer is heated or pressurized to cause the coloring component contained in the photosensitive and heat sensitive recording layer or photosensitive and pressure sensitive recording layer to react with a compound which forms color by reaction with the coloring component or with a specific group of the compound which group form color with the coloring component and to form color in the form of the previously formed latent image. In order to control the maximum coloring density of the color image, means such as full-face exposure by radiating light rays with wavelength corresponding to the sensitive ranges of respective colors and in light quantities to give desired coloring densities may be employed.

As the light source to be used for the image formation in the exposure step, any light sources may be optionally selected from light sources emitting light with wavelength in a range from ultraviolet to infrared regions by using light absorption materials such as spectral sensitizing compounds and the like having absorption in specified regions in the photosensitive and heat sensitive recording layer. More substantially, light sources having the maximum absorption wavelength in a range from 300 to 1,000 nm are preferable.

In this case, light sources having wavelength corresponding to the absorption wavelength of the light absorption materials such as organic dyes are preferably used. By properly selecting the light absorption materials in such a manner, blue to red-radiating light sources and compact and economical infrared laser can be used and not only the application possibility is widened but also the sensitivity and the sharpness can be improved.

Among them as described above, use of laser light sources or LED of blue-color, green-color, and red-color is preferable in terms of the simplification and miniaturization of the apparatus and achievement of the cost down.

The image recording method of the present invention comprises the fixation step carried out by further radiating light from a specific light source to the whole surface of the recording material after the above-described color forming step to fix the image formed in the above-described color forming step and to decolor the coloration by the photopolymerization initiator component remaining in the recording layer. By completing the fixation step, the whiteness of the non-image areas can be increased and a chemically stable final image can be obtained. Further, in the case, diazonium salt is used as the coloring component, the diazonium salt remaining in the recording layer after the image formation can be inactivated by light radiation, so that the fixation step can contribute to the improvement of the storage stability of formed images with little density change and fading.

As the light sources usable for the above-described fixation process, a wide range of light sources such as a mercury lamp, an ultrahigh pressure mercury lamp, an electroless discharge type mercury lamp, a xenon lamp, a tungsten lamp, a metal halide lamp, a fluorescent lamp and the like can preferably be used.

It is preferable to properly and optionally select, among them, light sources having wavelength corresponding to the absorption wavelength of the organic dye and organic boron compound used for the photosensitive and heat sensitive recording layer or the photosensitive and pressure sensitive recording layer of the photosensitive and heat sensitive recording material.

The method for radiating light using the above-described light sources in the fixation step is not particularly restricted and a method for entirely radiating the whole recording layer surface at once or a method of gradually exposing the recording face to light and finally exposing the whole surface area such as scanning may be employed and a method is applicable if it can finally radiate the entire recording face of the photosensitive and heat sensitive recording materials after image formation using approximately uniform light rays. In such a manner, light radiation to the entire recording layers is preferable from a viewpoint of improvement of the effects of the present invention.

The duration of light radiation using the light sources is required to be sufficient to fix the formed images and sufficiently decolor the background texture, and radiation is carried out for a duration preferably from several seconds to several ten seconds, more preferably several seconds to several minutes, from a viewpoint of achievement of sufficient image fixation and decoloration.

EXAMPLES

Hereinafter, examples of the present invention will be described, however the present invention is not at all restricted to these examples. In the following examples, % represents % by weight and "part", represents part by weight unless a specific remark is given.

Example 1 to Example 6

The following photopolymerizable compositions were prepared using the photo-radical-generating agents and the organic dyes as shown in Table 1

| [Photopolymerizable composition] | |
|---|---|
| pentaerythritol tetraacrylate | 1.41 g |
| benzyl methacrylate/methacrylic acid copolymer (73/27 mole ratio) | 1.29 g |
| ethyl methyl ketone | 12 g |
| propylene glycol monomethyl ether acetate | 8.62 g |
| a photo-radical-generating agent (reference to Table 1) | 0.18 g |
| an organic dye (reference to Table 1) | 0.03 g |
| an amine compound (reference to Table 1) | 0.12 g |
| methanol | 6 g | photo-radical-generating agent 1

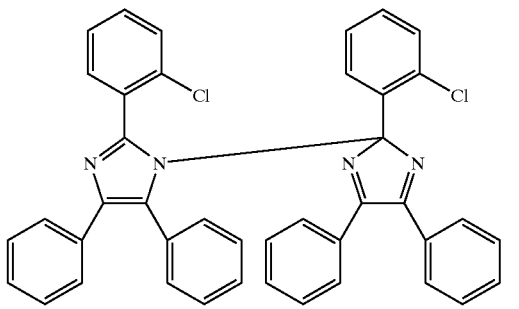

photo-radical-generating agent 2

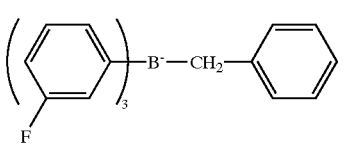

photo-radical-generating agent 3

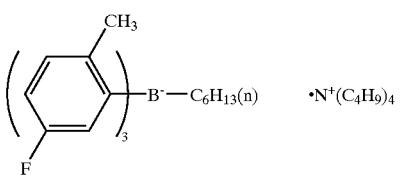

organic dye 1

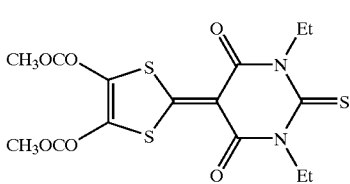

organic dye 2

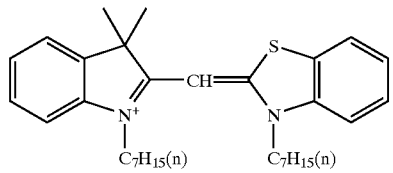

amine compound R1

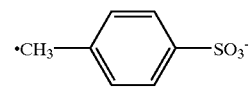

The respectively prepared photopolymerizable compositions were separately applied in a thickness of 2 μm on a 100 μm-thick polyethylene terephthalate film and dried at 100° C. for 5 minutes. Further, the following coating solution (1) for a protective layer was applied in a thickness of 1 μm thereon and dried at 100° C. for 2 minutes to produce the recording materials of Example 1 to Example 6.

| [Coating solution for protective layer (1)] | |
|---|---|
| water | 98 g |
| polyvinyl alcohol | 1.7 g |
| hydroxypropylmethyl cellulose | 1.7 g |
| polyvinylpyrrolidone | 8.7 g |

Comparative Example 1 to Comparative Example 4

Recording materials of Comparative example 1 to Comparative example 4 were prepared in the same manner as Example 1, except that the organic dye and the organic boron compound used for Example 1 were changed to the organic dyes and the organic boron compounds as shown in Table 1.

The prepared recording materials of Example 1 to Example 6 and Comparative example 1 to Comparative example 4 were exposed using a vacuum printing apparatus. Exposure to the recording materials were carried out by radiating light for 10 seconds from a 500 W xenon lamp (manufactured by Ushio Inc.) through a step wedge [the density step 0.15; the number of the density stages 1 to 15; [Fuji step guide P] manufactured by Fuji Photo Film Co., Ltd.) and [SC 38 Filter] (manufactured by Fuji Photo Film Co., Ltd., a sharp cut filter for cutting light of 380 nm wavelength or shorter)]. After the exposure, using a developer solution with the following composition, the respective recording materials were developed.

| anhydrated sodium carbonate | 10 g |
|---|---|
| butyl cellosolve | 5 g |
| water | 11 g |

Since the exposure dose to the areas corresponding to portions of the step wedge whose step numbers were large was low, the photopolymerizable compositions in the areas were dissolved in the developer solution and polyethylene terephthalate face was exposed. Regarding the respective recording materials of Examples, the areas where the photopolymerizable compositions were completely dissolved were investigated and the step number (clear step number) of the step wedge corresponding to the areas where the exposure dose was the highest was determined. That the determined stpe number was higher meant that the sensitivity of the recording material was higher. The results were shown in Table 1. In the case the sensitivity was low and consequently the photopolymerizable compositions in the entire exposed areas were dissolved in the developer solution, the term, "clear", was written in the Table, whereas in the case the sensitivity was high and consequently, the photopolymerizable compositions in the entire exposed areas were cured and remained even after development, the term, "solid", was written in the Table. The numerals in the columns of the organic dye shown in the following Table 1 represent the exemplified compound No. of the organic dyes.

Further, the above-described recording materials were left (after promotion time) for a day in the environments of 40° C. temperature and 90% humidity and then exposure and development were carried out in the same manner to determine the clear step number. That the difference of the time by second from that immediately after production was smaller meant the raw storage property was higher.

TABLE 1

|  | photo-radical-generating agent | organic dye | amine compound | clear step number immediately after application (/sheet) | clear step number after promotion time (/sheet) |
|---|---|---|---|---|---|
| Example 1 | 1 | — | 1 | 7 | 7 |
| Example 2 | 1 | — | 3 | 8 | 8 |
| Comparative example 1 | 1 | — | — | Clear | Clear |
| Comparative example 2 | 1 | — | R1 | 2 | Clear |
| Example 3 | 2 | 1 | 1 | 10 | 10 |
| Example 4 | 2 | 1 | 5 | 9 | 8 |
| Example 5 | 2 | 1 | 8 | 10 | 10 |
| Example 6 | 2 | 1 | 3 | 11 | 11 |
| Comparative example 3 | 2 | 1 | — | 3 | clear |
| Comparative example 4 | 2 | 1 | R1 | 3 | clear |

According to the results shown in Table 1, as compared with the recording materials of Comparative example 1 to Comparative example 4, the recording materials of Example 1 to Example 6 were found excellent in the sensitivity and the raw storage property.

Example 7

1. [Preparation of Electron-donating Colorless Dye Capsule Solution]

-1-a. Preparation of Electron-donating Colorless Dye (1) Capsule Solution-

The following electron-donating colorless dye (1) 8.9 g was dissolved in ethyl acetate 16.9 g and as encapsulating agents, Takenate D-110N (produced by Takeda Chemical Industries Ltd.) 20 g. and Millionate MR 200 (produced by Nippon Polyurethane Industry Co., Ltd.) 2 g were added thereto. The resulting solution was added to a solution mixture of 8% phthalated gelatin 42 g and 10% sodium dodecylbenzenesulfonate 1.4 g and emulsified and dispersed at 20° C. The obtained emulsion was mixed with water 14 g and an aqueous solution of 2.9% tetraethylene pentamine 72 g and heated to 60° C. while being stirred and after 2 hours, a capsule solution with an average particle size of 0.5 μm in which the electron-donating colorless dye (1) was encapsulating in capsules as a core was obtained.

electron-donating colorless dye (1)

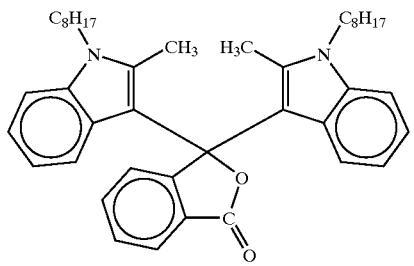

2. [Preparation of Emulsion of Photopolymerizable Composition]

-2-a. Preparation of Emulsion of Photopolymerizable Composition (7)-

The photo-radical-generating agents shown in Table 2 0.3 g; the organic dyes shown in Table 2 0.05 g; the amine compounds shown in Table 2 0.02 g; and the following polymerizable electron-donating compound (1) 4.2 g were added to and mixed with isopropyl acetate 5.3 g. polymerizable electron-donating compound (1)

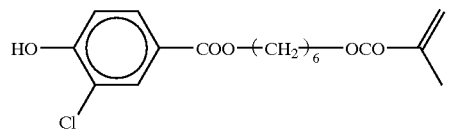

The obtained solution was added to a solution mixture of an aqueous 8% gelatin solution 13 g, an aqueous 2% surfactant (1) solution 0.8 g, and an aqueous 2% surfactant (2) solution 0.8 g and emulsified at 10,000 rotation for 5 minutes by a homogenizer (manufactured by Nippon Seiki Co., Ltd.) to obtain an emulsion of the photopolymerizable composition (7).

surfactant (1)

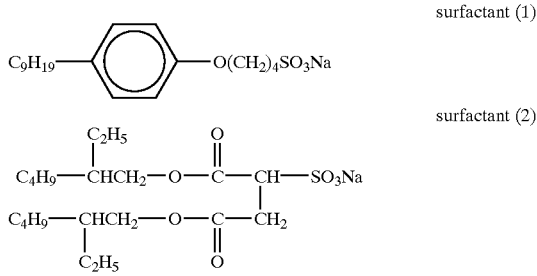

surfactant (2)

[Preparation of Coating Solution for Recording Layer]
-3-a. Preparation of Coating Solution for Recording Layer (7)

The electron-donating colorless dye-encapsulating solution 4 g, the emulsion of the photopolymerizable composition (7) 12 g, and an aqueous 15% gelatin solution 12 g were mixed to obtain a coating solution for recording layer (7).
-4.- [Preparation of Coating Solution (2) for Protective Layer]
4-a. Preparation of Coating Solution (2) for Protective Layer An aqueous 10% gelatin solution 4.5 g, distilled water 4.5 g, an aqueous 2% surfactant (3) solution 0.5 g, an aqueous 2% surfactant (4) solution 0.3 g, an aqueous 2% hardener (1) solution 0.5 g, and Syloid 72 (produced by FUJI-DEVISON CHEMICAL LTD.) in a proper amount to be coating amount corresponding of 50 mg/m² were mixed with Snowtex N 1 g to produce the coating solution (2) for protective layer.

surfactant (3)

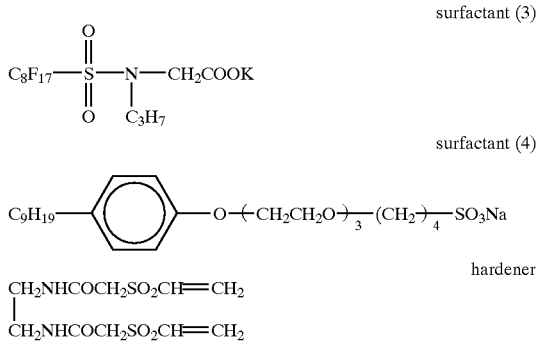

surfactant (4)

hardener

5. [Support]

A 100 μm-thick white color polyester film (Lumirror E68L; produced by Toray Industries, Inc.) containing a white pigment was used as a support. To the support, the coating solution (7) for a recording layer was applied by a coating bar so that the dry weight of the coating layer was 6 g/m² and dried at 30° C. for 10 minutes. To the resulting support, the coating solution (2) for a protective layer was applied by a coating bar so that the dry weight of the coating layer was 2 g/m² and dried at 30° C. for 10 minutes to obtain a recording material of Example 7.

Example 8 to Example 12

Recording materials of Example 8 to Example 12 were obtained in the same manner as Example 7, except the photo-radical-generating agent, the organic dye, the amine compound used for Example 7 were respectively changed to the photo-radical-generating agents, the organic dyes, the amine compounds as shown in Table 2.

Comparative Example 5 to Comparative Example 7

Recording materials of Comparative example 5 to Comparative example 7 were obtained in the same manner as Example 7, except the photo-radical-generating agent, the organic dye, the amine compound used for Example 7 were respectively changed to the photo-radical-generating agents, the organic dyes, the amine compounds as shown in Table 2.

The produced recording materials of Example 7 to Example 12 and the recording materials of Comparative example 5 to Comparative example 7 were exposed using a vacuum printing apparatus by radiating light for 30 seconds from a 500 W xenon lamp (manufactured by Ushio Inc.) through a step wedge and SC 38 Filter to form latent images in respective recording materials. After that, when respective recording materials were heated a 125° C. for 15 seconds with a hot plate, a color generated by reaction of the electron-donating colorless dye (1) and the polymerizable electron-accepting compound (1) was formed in the unexposed areas and the color density was decreased or color was not formed in the exposed areas. The areas where color was not formed were investigated and the step number (the clear step number) of the step wedge corresponding to the areas where the exposure dose was lowest was determined. That the determined step number was higher meant that the sensitivity of the recording material was higher. The results were shown in Table 2.

In the case the sensitivity was high and consequently color was not formed in all the steps, the term, "clear", was written in the Table, whereas in the case the sensitivity was low and consequently, the color was formed in all steps, the term, "solid", was written in the Table.

Further, the above-described recording materials were left (after promotion time) for a day in the environments of 40° C. temperature and 90% humidity and then exposure and heating were carried out in the same manner to determine the clear step number. That the difference of the step number from that immediately after production was smaller meant the raw storage property was higher.

TABLE 2

| | photo-radical-generating agent | organic dye | amine compound | clear step number immediately after application (/sheet) | clear step number after promotion time (/sheet) |
|---|---|---|---|---|---|
| Example 7 | 2 | 1 | 1 | 10 | 10 |
| Example 8 | 2 | 1 | 5 | 8 | 7 |
| Example 9 | 2 | 1 | 8 | 10 | 10 |
| Example 10 | 2 | 1 | 3 | 11 | 11 |
| Example 11 | 2 | 1 | 4 | 11 | 11 |
| Example 12 | 3 | 2 | 1 | 10 | 9 |
| Comparative example 5 | 2 | 1 | — | 3 | solid |

TABLE 2-continued

| | photo-radical-generating agent | organic dye | amine compound | clear step number immediately after application (/sheet) | clear step number after promotion time (/sheet) |
|---|---|---|---|---|---|
| Comparative example 6 | 2 | 1 | — | 3 | solid |
| Comparative example 7 | 3 | 2 | — | 2 | solid |

According to the results shown in Table 2, as compared with the recording materials of Comparative example 5 to Comparative example 7, the recording materials of Example 7 to Example 12 were found excellent in the sensitivity and the raw storage property.

What is claimed is:

1. A photopolymerizable composition comprising: a polymerizable compound including an addition-polymerizable unsaturated bond; a photo-radical-generating agent; and an amine compound represented by the following general formula (I):

General formula (I)

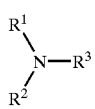

in which: $R^1$ and $R^2$ each represent a hydrogen atom or an aliphatic group, and may be the same as or different from one another; each aliphatic group may be further substituted; $R^1$ and $R^2$ may form a ring by bonding directly or via a substituent; and $R^3$ represents a benzyl group, which may be further substituted, wherein the photo-radical-generating agent comprises an organic boron compound represented by the following general formula (II):

General formula (II)

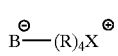

in which: R represents groups selected from the group consisting of alkyl groups, aryl groups, aralkyl groups, alkenyl groups, alkynyl groups, heterocyclic groups, and derivatives thereof; the groups R may be the same as or different from one another; two or more of the groups R may be bonded directly or via a substituent so as to form a boron-including heteroring; and X represents a group capable of forming a cation.

2. The photopolymerizable composition according to claim 1, further comprising an organic dye.

3. The photopolymerizable composition according to claim 2, wherein the organic dye comprises at least one of an anionic organic dye, a nonionic organic dye, and a cationic organic dye, which cationic organic dye may form a salt with the organic boron compound represented by the general formula (II).

4. A recording material comprising a support and, on the support, a recording layer including the photopolymerizable composition of claim 1.

5. A recording material comprising a support and, on the support, a recording layer including the photopolymerizable composition of claim 2.

6. A recording material comprising a support and, on the support, a recording layer including the photopolymerizable composition of claim 3.

7. A recording material comprising a support and, on the support, a recording layer including: microcapsules containing a coloring component; and the photopolymerizable composition of claim 1, the polymerizable compound including a site capable of reacting with the coloring component to form color.

8. A recording material comprising a support and, on the support, a recording layer including: microcapsules containing a coloring component; and the photopolymerizable composition of claim 2, the polymerizable compound including a site capable of reacting with the coloring component to form color.

9. A recording material comprising a support and, on the support, a recording layer including: microcapsules containing a coloring component; and the photopolymerizable composition of claim 3, the polymerizable compound including a site capable of reacting with the coloring component to form color.

10. A recording material comprising a support and, on the support, a recording layer including: microcapsules containing a coloring component; a coloring compound capable of reacting with the coloring component to form color; and the photopolymerizable composition of claim 1, the polymerizable compound including a site capable of suppressing the reaction of the coloring component and the coloring compound.

11. A recording material comprising a support and, on the support, a recording layer including: microcapsules containing a coloring component; a coloring compound capable of reacting with the coloring component to form color; and the photopolymerizable composition of claim 2, the polymerizable compound including a site capable of suppressing the reaction of the coloring component and the coloring compound.

12. A recording material comprising a support and, on the support, a recording layer including: microcapsules containing a coloring component; a coloring compound capable of reacting with the coloring component to form color; and the photopolymerizable composition of claim 3, the polymerizable compound including a site capable of suppressing the reaction of the coloring component and the coloring compound.

13. The recording material according to claim 4, further comprising at least one other recording layer layered thereon, the respective recording layers being sensitive to lights of respectively different central wavelengths.

14. The recording material according to claim 5, further comprising at least one other recording layer layered thereon, the respective recording layers being sensitive to lights of respectively different central wavelengths.

15. The recording material according to claim 6, further comprising at least one other recording layer layered thereon, the respective recording layers being sensitive to lights of respectively different central wavelengths.

16. A photopolymerizable composition comprising: a polymerizable compound including an addition-polymerizable unsaturated bond; a photo-radical-generating agent; and an amine compound represented by the following general formula (I):

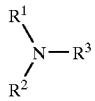

General formula (I)

in which: $R^1$ and $R^2$ each represent a hydrogen atom or an aliphatic group, and may be the same as or different from one another, each aliphatic group may be further substituted; $R^1$ and $R^2$ may form a ring by bonding directly or via a substituent; and $R^3$ represents a benzyl group, which may be further substituted, wherein the photo-radical-generating agent is a lophine dimer.

17. A recording material comprising a support and, on the support, a recording layer including the photopolymerizable composition of claim 16.

* * * * *